US007928872B2

(12) United States Patent
Nakajima

(10) Patent No.: US 7,928,872 B2
(45) Date of Patent: Apr. 19, 2011

(54) ANALOG-TO-DIGITAL CONVERTER

(75) Inventor: Yuji Nakajima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/582,431

(22) Filed: Oct. 20, 2009

(65) Prior Publication Data

US 2010/0097260 A1 Apr. 22, 2010

(30) Foreign Application Priority Data

Oct. 21, 2008 (JP) .................................. 2008-270804
May 20, 2009 (JP) .................................. 2009-122421

(51) Int. Cl.
*H03M 1/06* (2006.01)

(52) U.S. Cl. ........ 341/118; 341/117; 341/120; 341/119; 341/155

(58) Field of Classification Search .................. 341/155, 341/117–120, 159
See application file for complete search history.

(56) References Cited

U.S. PATENT DOCUMENTS

| | | | | |
|---|---|---|---|---|
| 5,990,707 A | * | 11/1999 | Goldenberg et al. | 327/64 |
| 5,990,814 A | * | 11/1999 | Croman et al. | 341/118 |
| 6,285,308 B1 | * | 9/2001 | Thies et al. | 341/155 |
| 6,847,320 B1 | | 1/2005 | Taft et al. | |
| 7,212,144 B1 | * | 5/2007 | Sutardja | 341/159 |
| 7,312,732 B2 | * | 12/2007 | Engl | 341/118 |
| 2007/0194960 A1 | * | 8/2007 | Wang et al. | 341/120 |

OTHER PUBLICATIONS

Robert C. Taft et al., A 1.8-V 1.6-GSamples/s 8-b Self-Calibrating folding ADC With 7.26 ENOB at Nyquist Frequency, Journal of Solid-State Circuits, Dec. 2004, vol. 39, No. 12, 9 pages.

* cited by examiner

*Primary Examiner* — Jean B Jeanglaude
(74) *Attorney, Agent, or Firm* — Foley & Lardner LLP

(57) ABSTRACT

An analog-to-digital converter includes a first preamplifier receiving a first reference voltage and an input signal, a second preamplifier receiving a second reference voltage and the input signal, a first preamplifier calibrator placed for the first preamplifier and adjusting an input offset of the first preamplifier, a second preamplifier calibrator placed for the second preamplifier and adjusting an input offset of the second preamplifier, an interpolator placed between output terminals of the first and second preamplifiers and generating an interpolation signal having a voltage value between a first output signal from the first preamplifier and a second output signal from the second preamplifier, comparators receiving the first output signal, the second output signal or the interpolation signal and outputting a digital value based on the received signal, and comparator calibrators placed for at least comparators receiving the interpolation signal among the comparators and adjusting input offsets of the corresponding comparators.

16 Claims, 17 Drawing Sheets

ANALOG-TO-DIGITAL CONVERTER

BACKGROUND

1. Field of the Invention

The present invention relates to an analog-to-digital converter and, particularly, to an analog-to-digital converter including first and second preamplifiers that amplify a value of an analog input signal based on different reference voltages and comparators that convert an interpolation signal interpolating the outputs of the first and second preamplifiers into a digital value.

2. Description of Related Art

Recently, in the signal processing field, signal processing based on digital signals has become mainstream. Thus, if an externally input signal is a signal having an analog value (which is referred to hereinafter as an analog signal), the analog signal is converted to a digital signal and processed. One of circuits that perform such conversion processing is an analog-to-digital converter. The analog-to-digital converter includes a comparator that compares a value of an input analog signal with a value of a reference signal and converts the analog signal to a digital signal. The comparator, however, generally has an offset. Due to the offset, in the comparator, a threshold for inverting the logic level of an output signal is deviated from a voltage value of a reference voltage. In order to perform analog-to-digital conversion with high accuracy, it is necessary to reduce the deviation of the threshold. One approach to eliminate the threshold deviation is to reduce the threshold deviation of the comparator by calibration processing.

Examples of calibration processing are disclosed in U.S. Pat. No. 6,847,320 and Journal of Solid and State Circuits, Vol. 39, No. 12, December 2004, P2107-2115, "A 1.8-V 1.6-GSample/s 8-b Self-Calibrating Folding ADC With 7.26 ENOB at Nyquist Frequency", Robert C. Taft et al. As an example of calibration processing, U.S. Pat. No. 6,847,320 is described hereinafter. FIG. 17 is a block diagram of an analog-to-digital converter 100 disclosed in U.S. Pat. No. 6,847,320. Referring to FIG. 17, in the analog-to-digital converter 100, an analog signal VIN is amplified by an amplifier 102 and an amplifier 104 and output to a node 156. On the other hand, the analog signal VIN is also amplified by an amplifier 106 and an amplifier 108 and output to a node 158. The amplifiers 102 and 106 amplify a voltage difference between a reference voltage generated by a reference voltage generator 110 and the analog signal VIN. Further, the amplifiers 104 and 108 have a single-end output structure. In the analog-to-digital converter 100, an interpolator 120 is placed between the node 156 and the node 158. The interpolator 120 generates an interpolation signal that interpolates a voltage of the node 156 and a voltage of the node 158.

The analog-to-digital converter 100 further includes a comparator CMPN0 that converts a voltage of the node 156 into a digital value, a comparator CMPN-10 that converts a voltage of the node 158 into a digital value, and comparators CMPN1 to CMPN2, and CMPN-11 that output digital signals based on the interpolation signal. The comparators CMPN0 to CMPN2, CMPN-10 and CMPN-11 are supplied with outputs of the amplifiers 104 and 108 and an output of the interpolator 120. Then, the comparators CMPN0 to CMPN2, CMPN-10 and CMPN-11 output digital values based on an input voltage and a preset threshold (a set value stored in each comparator).

At this time, in the analog-to-digital converter 100, an offset voltage of the amplifier 102 and the amplifier 104 is adjusted by a resistor Radj,N placed between the amplifier 102 and the amplifier 104 and a current Iadj,N output from a current source N. Further, an offset voltage of the amplifier 106 and the amplifier 108 is adjusted by a resistor Radj,N−1 placed between the amplifier 106 and the amplifier 108 and a current Iadj,N−1 output from a current source N−1.

The linearity of voltage values output to the nodes 156 and 158 is thereby improved. Thus, in the analog-to-digital converter 100, the offset voltage of the amplifiers 102, 104, 106, 108 are adjusted and the outputs of the amplifiers 104 and 108 are input to the comparators CMPN0 to CMPN2, CMPN-10 and CMPN-11, so that the linearity between the analog signal and the output digital signals is improved.

SUMMARY

However, an offset voltage occurs independently in the comparators CMPN0 to CMPN2, CMPN-10 and CMPN-11 that are placed in the subsequent stage, which degrades the linearity of output results. In the analog-to-digital converter 100, although the offset voltages of the amplifiers 102, 104, 106 and 108 are adjusted, the offset voltages in the comparators CMPN0 to CMPN2, CMPN-10 and CMPN-11 cannot be adjusted. Thus, the analog-to-digital converter 100 fails to reliably maintain the linearity of output results.

An exemplary aspect of the present invention is an analog-to-digital converter which includes a first preamplifier that receives a first reference voltage and an input signal, a second preamplifier that receives a second reference voltage and the input signal, a first preamplifier calibrator that is placed corresponding to the first preamplifier and adjusts an input offset of the first preamplifier, a second preamplifier calibrator that is placed corresponding to the second preamplifier and adjusts an input offset of the second preamplifier, an interpolator that is placed between an output terminal of the first preamplifier and an output terminal of the second preamplifier and generates an interpolation signal having a voltage value between a first output signal from the first preamplifier and a second output signal from the second preamplifier, a plurality of comparators that receive one of the first output signal, the second output signal and the interpolation signal and output a digital value based on the received signal, and a plurality of comparator calibrators that are placed respectively corresponding to at least comparators receiving the interpolation signal among the plurality of comparators and adjust input offsets of the corresponding comparators.

In the analog-to-digital converter according to the exemplary aspect of an embodiment of the present invention, a calibrator that adjusts an input offset is placed for both of the comparator and the first and second preamplifiers in the previous stage of the comparator. This eliminates the effect of the input offset on both of an output result of the comparator to which the analog signal is input through the interpolator and an output result of the comparator to which the analog signal is input without through the interpolator.

In the analog-to-digital converter according to the exemplary aspect of an embodiment of the present invention described above, it is possible to obtain output results having suitable linearity characteristics.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Exemplary embodiments of the present invention are described hereinafter with reference to the appended drawings. In the followings, an analog-to-digital converter in a configuration that amplifies an input signal (an analog input signal VIN having an analog value) as differential signals and supplies the differential signals to a comparator is described as an example of an analog-to-digital converter. The present invention, however, is not particularly limited as to in what form of signal an analog value is supplied to a comparator. Further, in the following description, an input offset voltage has a voltage value indicating a difference between an actual threshold for a preamplifier or a comparator to invert an output signal and an ideal value of the threshold.

Figure 1:
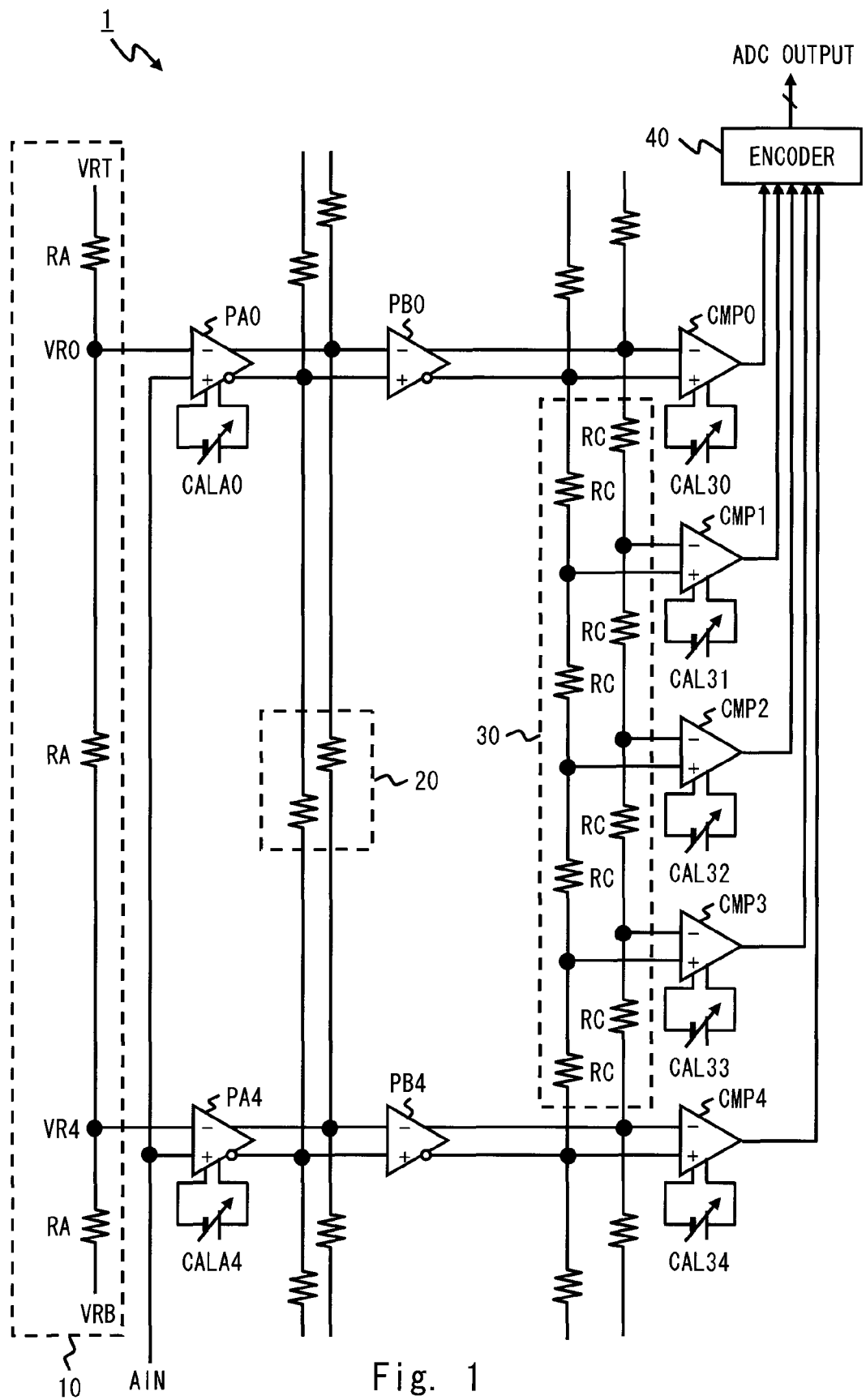
FIG. 1 is a block diagram showing an analog-to-digital converter according to a first exemplary embodiment.

FIG. 1 is a block diagram showing an analog-to-digital converter 1 according to a first exemplary embodiment of the present invention. Referring to FIG. 1, the analog-to-digital converter 1 includes a reference voltage generator 10, preamplifiers, a smoothing circuit 20, an interpolator 30, compara-tors, an encoder 40, preamplifier calibrators CALA0 and CALA4, and comparator calibrators CAL30 to CAL34.

The reference voltage generator 10 includes a plurality of resistors RA. The plurality of resistors RA are connected in series between a high-potential reference voltage VRT and a low-potential reference voltage VRB. Voltages generated at nodes where the resistors RA are connected to each other are output as reference voltages VR0 and VR4.

The preamplifiers include a plurality of preamplifiers (e.g. a first preamplifier and a second preamplifier). In this exemplary embodiment, the first preamplifier includes a previous-stage preamplifier PA0 and a subsequent-stage preamplifier PB0, and the second preamplifier includes a previous-stage preamplifier PA4 and a subsequent-stage preamplifier PB4.

An analog input signal AIN is input to the non-inverting input terminal of the previous-stage preamplifier PA0, and a reference voltage VR0 generated corresponding to the first preamplifier is input to the inverting input terminal of the previous-stage preamplifier PA0. Then, the previous-stage preamplifier PA0 amplifies a voltage difference between a voltage value of the analog input signal AIN and the reference voltage VR0 and outputs a result as differential signals. Further, a first preamplifier calibrator (e.g. a preamplifier calibrator CALA0) is connected to the previous-stage preamplifier PA0. The preamplifier calibrator CALA0 adjusts an input offset voltage of the previous-stage preamplifier PA0 based on a calibration set value. The subsequent-stage preamplifier PB0 further amplifies the differential signals output from the previous-stage preamplifier PA0 and output a result as a first output signal (differential signals).

Further, the analog input signal AIN is input to the non-inverting input terminal of the previous-stage preamplifier PA4, and a reference voltage VR4 generated corresponding to the second preamplifier is input to the inverting input terminal of the previous-stage preamplifier PA4. Then, the previous-stage preamplifier PA4 amplifies a voltage difference between a voltage value of the analog input signal AIN and the reference voltage VR4 and outputs a result as differential signals. Further, a second preamplifier calibrator (e.g. a preamplifier calibrator CALA4) is connected to the previous-stage preamplifier PA4. The preamplifier calibrator CALA4 adjusts an input offset voltage of the previous-stage preamplifier PA4 based on a calibration set value. The subsequent-stage preamplifier PB4 further amplifies the differential signals output from the previous-stage preamplifier PA4 and output a result as a second output signal (differential signals).

The smoothing circuit 20 is connected between an output node of the previous-stage preamplifier PA0 and an output node of the previous-stage preamplifier PA4. The smoothing circuit 20 smoothes a voltage at the output node of the previous-stage preamplifier PA0 and a voltage at the output node of the previous-stage preamplifier PA4. Specifically, the smoothing circuit 20 includes a plurality of resistors. The smoothing circuit 20 connects the output node connected to the non-inverting output terminal of the previous-stage preamplifier PA0 and the output node connected to the non-inverting output terminal of the previous-stage preamplifier PA4 by the resistor. Further, the smoothing circuit 20 connects the output node connected to the inverting output terminal of the previous-stage preamplifier PA0 and the output node connected to the inverting output terminal of the previous-stage preamplifier PA4 by the other resistor.

The interpolator 30 is connected between an output node of the subsequent-stage preamplifier PB0 and an output node of the subsequent-stage preamplifier PB4. The interpolator 30 generates interpolation signals that make interpolation between a voltage of the first output signal output from the subsequent-stage preamplifier PB0 and a voltage of the second output signal output from the subsequent-stage preamplifier PB4 (in this exemplary embodiment, a plurality of interpolation signals are generated). Specifically, the interpolator 30 includes a plurality of resistors RC. The interpolator 30 connects the output node connected to the non-inverting output terminal of the subsequent-stage preamplifier PB0 and the output node connected to the non-inverting output terminal of the subsequent-stage preamplifier PB4 by the plurality of resistors RC connected in series. Then, the interpolator 30 outputs the interpolation signals from nodes where the resistors RC are connected to one another. Further, the interpolator 30 connects the output node connected to the inverting output terminal of the subsequent-stage preamplifier PB0 and the output node connected to the inverting output terminal of the subsequent-stage preamplifier PB4 by the plurality of resistors RC connected in series. Then, the interpolator 30 outputs the interpolation signals from nodes where the resistors RC are connected to one another. In the following description, it is assumed that the resistors RC have the same resistance.

Any one of the first output signal, the second output signal and the interpolation signal is input to the comparators CMP0 to CMP4, and the respective comparators CMP0 to CMP4 output a digital value according to a voltage difference in the input signal (differential signals). Further, the comparator calibrators CAL30 to CAL34 are connected to the comparators CMP0 to CMP4, respectively. The comparator calibrators CAL30 to CAL34 adjust an input offset of a corresponding comparator according to the calibration set value.

Digital values output from the comparators CMP0 to CMP4 are input to the encoder 40. Then, the encoder 40 encodes the input digital values and outputs an ADC output signal.

The previous-stage preamplifier PA having the preamplifier calibrator is described hereinafter in further detail. In the following description, PA is used as a symbol for generically referring to the previous-stage preamplifier, CALA is used as a symbol for generically referring to the preamplifier calibrator corresponding to the previous-stage preamplifier, and PB is used as a symbol for generically referring to the subsequent-stage preamplifier, respectively depending on the circumstances.

Figure 2:
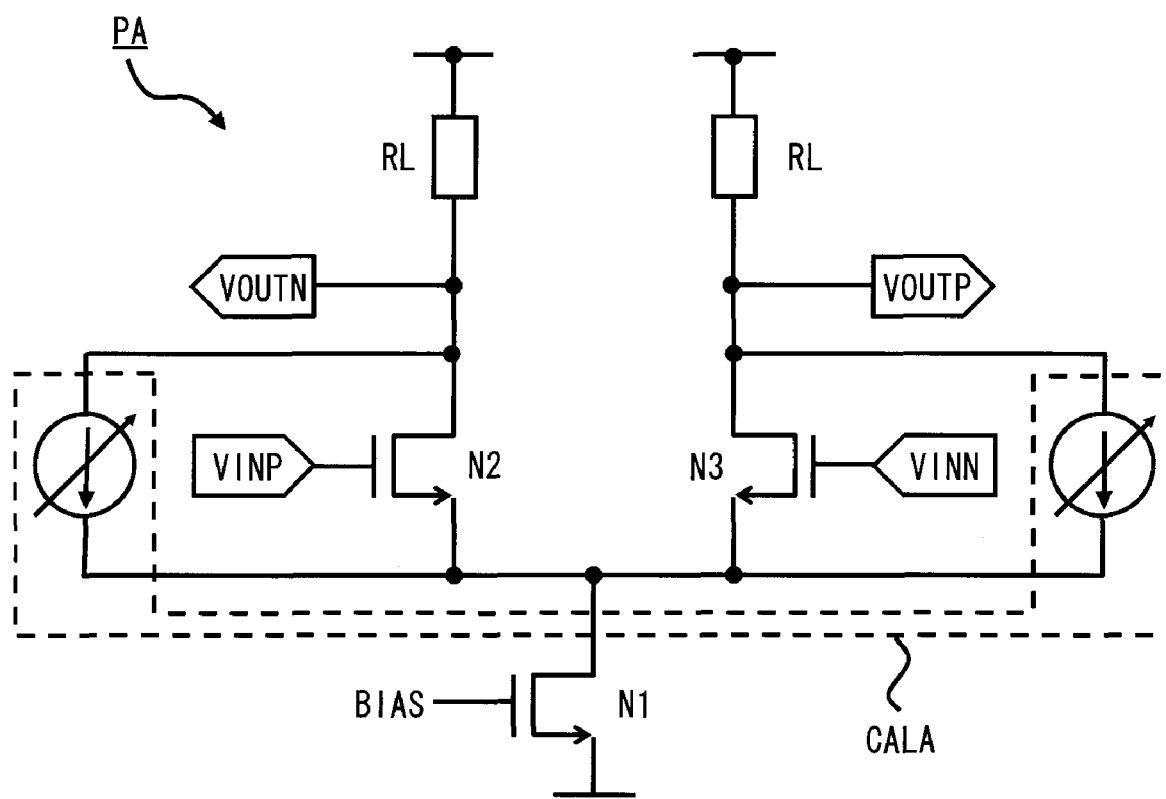
FIG. 2 is a circuit diagram showing a previous-stage preamplifier and a preamplifier calibrator according to the first exemplary embodiment.

FIG. 2 is a circuit diagram showing the previous-stage preamplifier and the preamplifier calibrator according to the first exemplary embodiment. As shown in FIG. 2, the previous-stage preamplifier PA includes NMOS transistors N1 to N3 and load resistors RL. The NMOS transistor N1 receives a bias voltage BIAS at its gate and functions as a constant current source. The NMOS transistors N2 and N3 form a differential pair in which their source terminals are connected in common and a current from the constant current source is supplied to the common connection point. The gate of the NMOS transistor N2 is the non-inverting input terminal of the previous-stage preamplifier PA. The gate of the NMOS transistor N3 is the inverting input terminal of the previous-stage preamplifier PA. The load resistor RL is connected between the drain of the NMOS transistor N2 and a power supply terminal. A connection point between the drain of the NMOS transistor N2 and the load resistor RL serves as the inverting output terminal. Further, a connection point between the drain of the NMOS transistor N3 and the load resistor RL serves as the non-inverting output terminal.

Further, as shown in FIG. 2, the preamplifier calibrator CALA includes a variable current source that is connected in parallel to the NMOS transistor N2 and a variable current source that is connected in parallel to the NMOS transistor N3. The preamplifier calibrator CALA cancels an offset of the previous-stage preamplifier PA by adjusting the current flowing into the load resistor RL according to a value of the current output from the variable current source. Thus, the preamplifier calibrator CALA adjusts a value of the current to output based on a calibration set value.

Figure 3:
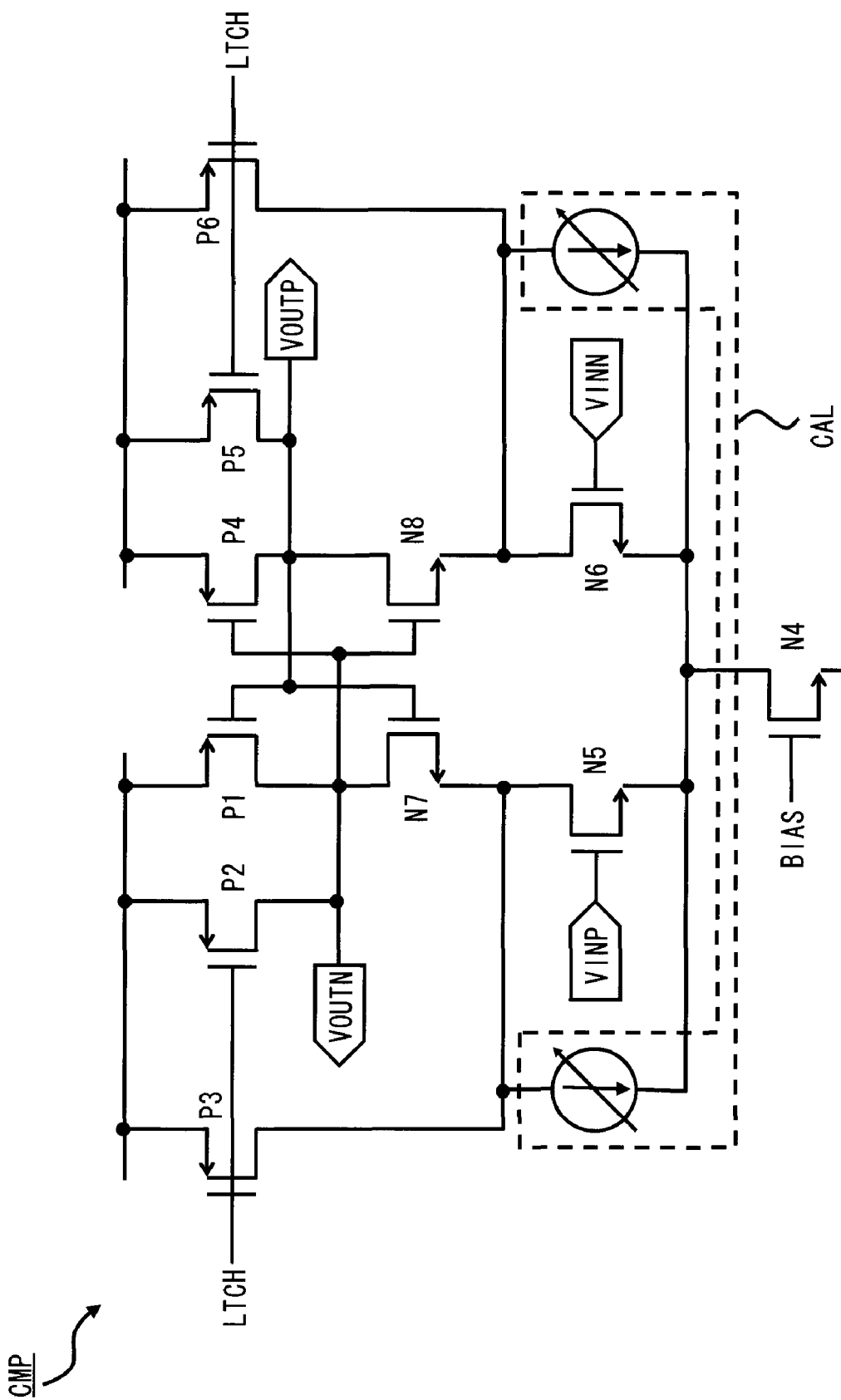
FIG. 3 is a circuit diagram showing a comparator and a comparator calibrator according to the first exemplary embodiment.

FIG. 3 is a circuit diagram showing the comparator and the comparator calibrator. In the following description, CMP is used as a symbol for generically referring to the comparator, and CAL is used as a symbol for generically referring to the comparator calibrator corresponding to the comparator, respectively depending on the circumstances.

As shown in FIG. 3, the comparator CMP includes NMOS transistors N4 to N8 and PMOS transistors P1 to P6. The NMOS transistor N4 receives a bias voltage BIAS at its gate and functions as a constant current source. The NMOS transistors N5 and N6 form a differential pair in which their source terminals are connected in common and a current from the constant current source is supplied to the common connection point. The gate of the NMOS transistor N5 is the non-inverting input terminal of the comparator CMP. The gate of the NMOS transistor N6 is the inverting input terminal of the comparator CMP. The NMOS transistors N7 and N8 and the PMOS transistors P1 and P4 form a latch circuit. With the latch circuit, the comparator CMP latches the output of the differential pair formed by the NMOS transistors N5 and N6 and outputs it. The latch circuit has an inverting output terminal VOUTN and a non-inverting output terminal VOUTP.

The PMOS transistor P2 is connected between the inverting output terminal VOUTN and a power supply terminal and determines the state of the inverting output terminal VOUTN based on a latch control signal LTCH. The PMOS transistor P5 is connected between the non-inverting output terminal VOUTP and a power supply terminal and determines the state of the non-inverting output terminal VOUTP based on a latch control signal LTCH. The PMOS transistor P3 is connected between the drain of the NMOS transistor N5 and the power supply terminal and determines a voltage of the drain of the NMOS transistor N5 based on the latch control signal LTCH. The PMOS transistor P6 is connected between the drain of the NMOS transistor N6 and the power supply terminal and determines a voltage of the drain of the NMOS transistor N6 based on the latch control signal LTCH. The latch control signal LTCH is a signal for controlling the timing of performing a comparison operation in the comparator CMP, and it is input from a control circuit, which is not shown. For example, the comparator CMP stops operating when the latch control signal LTCH is Low level, and performs a comparison operation when it is High level.

Further, as shown in FIG. 3, the comparator calibrator CAL includes a variable current source that is connected in parallel to the NMOS transistor N5 and a variable current source that is connected in parallel to the NMOS transistor N6. The comparator calibrator CAL cancels an offset of the comparator CMP by adjusting the current flowing into the latch circuit according to a value of the current output from the variable current source. Thus, the comparator calibrator CAL adjusts a value of the current to output based on a calibration set value.

Figure 4:
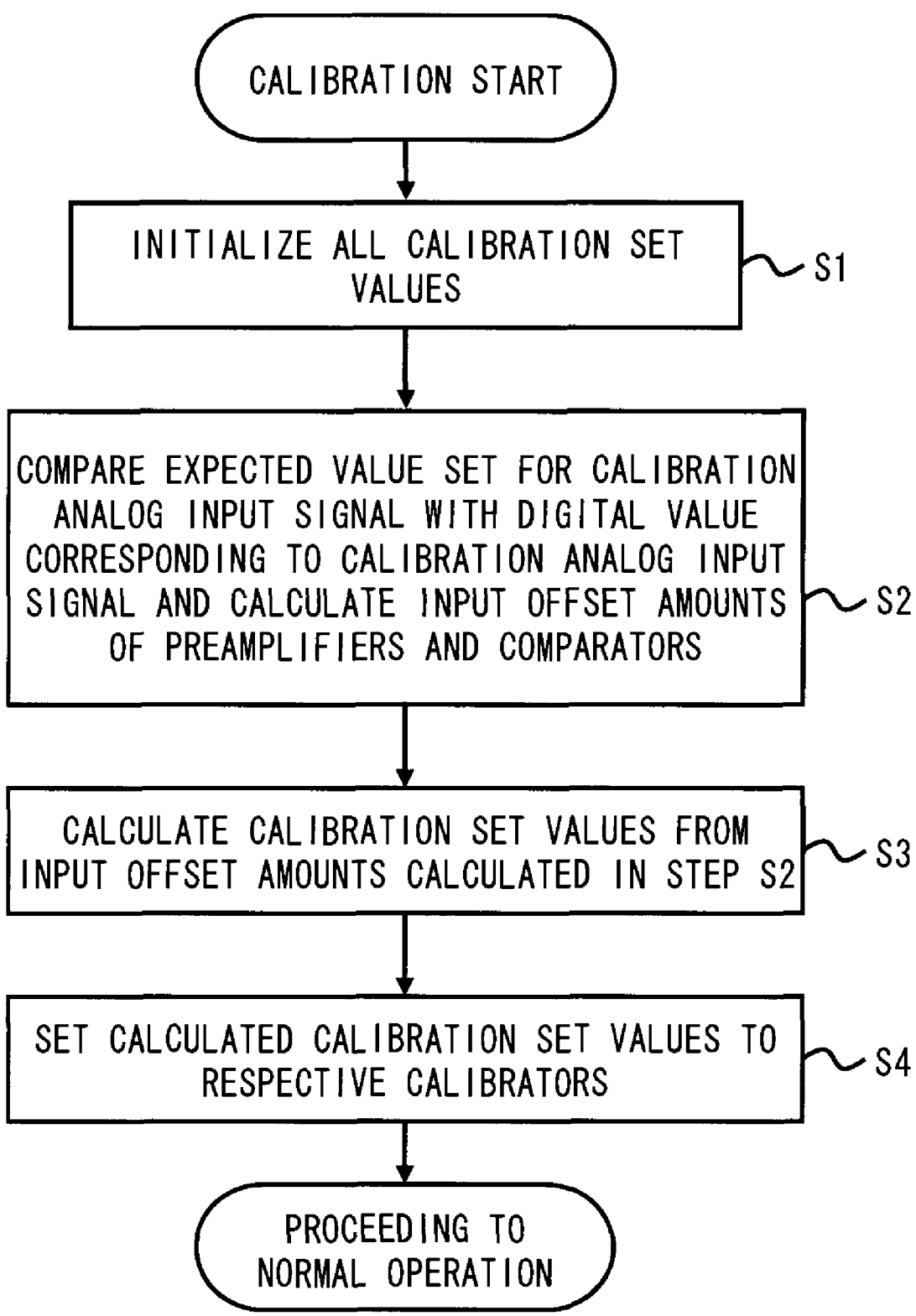
FIG. 4 is a flowchart showing a procedure of setting calibration set values in the analog-to-digital converter according to the first exemplary embodiment.

In the analog-to-digital converter 1, calibration set values are calculated during a calibration period before the start of a normal operation. By supplying the calculated calibration set values to the preamplifier calibrators CALA0 and CALA4 and the comparator calibrators CAL30 to CAL34, the input offsets generated in the preamplifiers and the comparators are canceled. FIG. 4 is a flowchart showing a procedure of setting calibration set values in the analog-to-digital converter 1.

Referring to FIG. 4, in the analog-to-digital converter 1, calibration set values of the preamplifier calibrators CALA0 and CALA4 and the comparator calibrators CAL30 to CAL34 are initialized at the start of the calibration operation (step S1). Next, a calibration analog input signal AIN is input, and a digital value corresponding to the calibration analog input signal AIN is obtained from each comparator. Then, the digital value obtained from each comparator is compared with an expected value that is preset corresponding to the calibration analog input signal AIN, and an input offset amount of each preamplifier and comparator is calculated (step S2).

Then, a calibration set value to be applied to each calibrator is calculated from the input offset amount obtained in the step S2 (step S3). After that, the calculated calibration set value is set to each of the preamplifier calibrators and the comparator calibrators (step 4). A configuration of canceling the input offsets of the preamplifiers and the comparators of the analog-to-digital converter 1 is thereby made, and then the analog-to-digital converter 1 operates in the normal operation mode.

A method of calculating the calibration set values in the step S3 is described hereinbelow. Input-referred offsets of the analog-to-digital converter corresponding to the transition of the comparators CMP0 to CMP4 are represented by the following expressions (1) to (5). In the expressions (1) to (5), an input-referred offset of the analog-to-digital converter corresponding to the transition of the comparator CMP0 is represented as InOff30, an input-referred offset of the analog-to-digital converter corresponding to the transition of the comparator CMP1 is represented as InOff31, an input-referred offset of the analog-to-digital converter corresponding to the transition of the comparator CMP2 is represented as InOff32, an input-referred offset of the analog-to-digital converter corresponding to the transition of the comparator CMP3 is represented as InOff33, and an input-referred offset of the analog-to-digital converter corresponding to the transition of the comparator CMP4 is represented as InOff34.

Further, in the expressions (1) to (5), an input-referred offset of the previous-stage preamplifier PA0 is represented as OffA0, an input-referred offset of the subsequent-stage preamplifier PB0 is represented as OffB0, an input-referred offset of the previous-stage preamplifier PA4 is represented as OffA4, and an input-referred offset of the subsequent-stage preamplifier PB4 is represented as OffB4. An input-referred offset of the comparator CMP0 is represented as Off30, an input-referred offset of the comparator CMP1 is represented as Off31, an input-referred offset of the comparator CMP2 is represented as Off32, an input-referred offset of the comparator CMP3 is represented as Off33, and an input-referred offset of the comparator CMP4 is represented as Off34. A calibration set value of the preamplifier calibrator CALA0 is represented as CALA0, and a calibration set value of the preamplifier calibrator CALA4 is represented as CALA4. A calibration set value of the comparator calibrator CAL30 is represented as CAL30, a calibration set value of the comparator calibrator CAL31 is represented as CAL31, a calibration set value of the comparator calibrator CAL32 is represented as CAL32, a calibration set value of the comparator calibrator CAL33 is represented as CAL33, and a calibration set value of the comparator calibrator CAL34 is represented as CAL34. An amplification factor of the previous-stage preamplifiers PA0 and PA4 is represented as A1, and an amplification factor of the subsequent-stage preamplifiers PB0 and PB4 is represented as A2.

$$InOff30 = (OffA0 - CALA0) + \frac{OffB0}{A1} + \frac{Off30 - CAL30}{A1 \times A2} \qquad (1)$$

$$InOff31 = \frac{\left(\left(OffA0 - CALA0\right) + \frac{OffB0}{A1}\right) \times 3 + \left(\left(OffA4 - CALA4\right) + \frac{OffB4}{A1}\right)}{4} + \frac{Off31 - CAL31}{A1 \times A2} \qquad (2)$$

$$InOff32 = \frac{\left(\left(OffA0 - CALA0\right) + \frac{OffB0}{A1}\right) + \left(\left(OffA4 - CALA4\right) + \frac{OffB4}{A1}\right)}{2} + \frac{Off32 - CAL32}{A1 \times A2} \qquad (3)$$

$$InOff33 = \frac{\left(\left(OffA0 - CALA0\right) + \frac{OffB0}{A1}\right) + \left(\left(OffA4 - CALA4\right) + \frac{OffB4}{A1}\right) \times 3}{4} + \frac{Off33 - CAL33}{A1 \times A2} \qquad (4)$$

$$InOff34 = (OffA4 - CALA4) + \frac{OffB0}{A1} + \frac{Off34 - CAL34}{A1 \times A2} \qquad (5)$$

In this exemplary embodiment, a calibration set value CAL30 of the comparator calibrator CAL30 placed corresponding to the comparator CMP0 to which the first output signal is input from the first preamplifier is zero. Further, a calibration set value CAL34 of the comparator calibrator CAL34 placed corresponding to the comparator CMP4 to which the second output signal is input from the second preamplifier is zero. If the expressions (1) to (5) are solved by setting the input-referred offsets of the analog-to-digital converter corresponding to the transition of all the comparators to zero, the calibration set values CALA0, CALA4 and CAL31 to CAL33 can be obtained by the following expressions (6) to (10).

$$CALA0 = OffA0 + \frac{OffB0}{A1} + \frac{Off30}{A1 \times A2} \qquad (6)$$

$$CALA4 = OffA4 + \frac{OffB4}{A1} + \frac{Off34}{A1 \times A2} \qquad (7)$$

$$CAL31 = \frac{-3Off30 + 4Off31 - Off34}{4} \qquad (8)$$

$$CAL32 = \frac{-Off30 + 2Off32 - Off34}{2} \qquad (9)$$

$$CAL33 = \frac{-Off30 + 4Off32 - 3Off34}{4} \qquad (10)$$

Thus, by setting the calibration set values CAL30 and CAL34 to zero and setting the other calibration set values according to the expressions (6) to (10), the digital values of the analog-to-digital converter 1 are not affected by the input offsets of the preamplifiers and the comparators. By such setting, it is possible to maintain suitable linearity characteristics between the analog input signal AIN and the digital values in the analog-to-digital converter 1.

As described above, in the analog-to-digital converter 1 according to the exemplary embodiment, the preamplifier calibrators CALA0 and CALA4 are placed for the preamplifiers that amplify an analog input signal and transfer the amplified signal to the comparators. The effect of the input offsets on the digital values output from the comparator CMP0 that receives the first output signal (analog input signal) and the comparator CMP4 that receives the second output signal (analog input signal) is canceled, and the linearity of the digital values is improved. The calibration set values set to the preamplifier calibrators CALA0 and CALA4 are values for canceling the input offset of the previous-stage preamplifiers, the subsequent-stage preamplifiers and the comparators.

Further, the comparator calibrators CAL31, CAL32 and CAL33 are placed for the comparators CMP1 to CMP3 that receive the interpolation signal (analog input signal) from the interpolator 30. The effect of the input offsets on the digital values output from the comparators CMP1 to CMP3 that receive the interpolation signal is thereby canceled, and the linearity of the digital values is improved.

Therefore, in the analog-to-digital converter 1 according to the exemplary embodiment, the calibrators for canceling the input offsets are placed for both of the preamplifiers and the comparators, thereby improving the linearity of the digital values which are output from all comparators including the comparators that receive the analog input signal through the interpolator 30.

The effect of improving the linearity of the digital values in the analog-to-digital converter 1 according to the exemplary embodiment is further described hereinbelow. An issue occurring in the case of not using the preamplifier calibrators CALA0 and CALA4 in the above-described analog-to-digital converter 1 is described firstly. Input-referred offsets InOff30 to InOff34 of the analog-to-digital converter corresponding to the transition of the comparators CMP0 to CMP4 in the case of not using the preamplifier calibrators CALA0 and CALA4 are represented by the following expressions (11) to (15).

$$InOff30 = OffA0 + \frac{OffB0}{A1} + \frac{Off30 - CAL30}{A1 \times A2} \tag{11}$$

$$InOff31 = \frac{\left(OffA0 + \frac{OffB0}{A1}\right) \times 3 + \left(OffA4 + \frac{OffB4}{A1}\right)}{4} + \frac{Off31 - CAL31}{A1 \times A2} \tag{12}$$

$$InOff32 = \frac{\left(OffA0 + \frac{OffB0}{A1}\right) + \left(OffA4 + \frac{OffB4}{A1}\right)}{2} + \frac{Off32 - CAL32}{A1 \times A2} \tag{13}$$

$$InOff33 = \frac{\left(OffA0 + \frac{OffB0}{A1}\right) + \left(OffA4 + \frac{OffB4}{A1}\right) \times 3}{4} + \frac{Off33 - CAL33}{A1 \times A2} \tag{14}$$

$$InOff34 = OffA4 + \frac{OffB4}{A1} + \frac{Off34 - CAL34}{A1 \times A2} \tag{15}$$

If the expressions (11) to (15) are solved by setting the input-referred offsets InOff30 to InOff34 to zero, the calibration set values CAL30 to CAL34 are represented by the following expressions (16) to (20).

$$CAL30 = A1 \times A2 \times OffA0 + A2 \times OffB0 + Off30 \tag{16}$$

$$CAL31 = A1 \times A2 \times \frac{3OffA0 + OffA4}{4} + A2 \times \frac{3OffB0 + OffB4}{4} + Off31 \tag{17}$$

$$CAL32 = A1 \times A2 \times \frac{2OffA0 + 2OffA4}{4} + A2 \times \frac{2OffB0 + 2OffB4}{4} + Off32 \tag{18}$$

$$CAL33 = A1 \times A2 \times \frac{OffA0 + 3OffA4}{4} + A2 \times \frac{OffB0 + 3OffB4}{4} + Off33 \tag{19}$$

$$CAL34 = A1 \times A2 \times OffA4 + A2 \times OffB4 + Off34 \tag{20}$$

The expressions (16) to (20) show that it is possible in the analog-to-digital converter 1 to improve the linearity of the digital values that are output from the comparators with use of the comparator calibrators CAL30 to CAL34 only. However, referring to the expressions (16) to (20), the calibration set values CAL30 to CAL34 contain a term that has the amplification factor A1 of the previous-stage preamplifier and the amplification factor A2 of the subsequent-stage preamplifier as multiplicands. Generally, the amplification factors A1 and A2 are large values, and the values of the calibration set values CAL30 to CAL34 having such large values as multiplicands are likely to be very large. Further, the analog-to-digital converter operates in a given power supply voltage range. Thus, if a larger value than the power supply voltage range is calculated as a calibration set value, the input offsets of the analog-to-digital converter 1 cannot be sufficiently canceled. There is thus a possibility that the linearity of the output result of the analog-to-digital converter 1 cannot be sufficiently improved by simply adjusting the input offsets of the comparators.

In light of this, in the analog-to-digital converter 1 according to the exemplary embodiment, adjustment of the input offsets for preamplifiers is performed in addition to adjustment of the input offsets for comparators. The calibration set values shown in the above expressions (6) to (10) are thereby obtained. Referring to the expressions (6) to (10), each calibration set value does not contain the amplification factors A1 and A2 as multiplicands. In the expressions (6) to (10), the amplification factors A1 and A2 are contained only as divisors. It is thus possible in the analog-to-digital converter 1 according to the exemplary embodiment to set the calibration set values to be lower than the calibration set values represented by the expressions (16) to (20), thereby obtaining practical calibration set values as adjustment values of the input offsets.

Further, in the analog-to-digital converter 1 according to the exemplary embodiment, the calibration set values input to the preamplifiers and the comparators are independent values for the respective elements. Thus, in the analog-to-digital converter 1 according to the exemplary embodiment, even if the elements including the preamplifiers and the comparators have input offsets with different variations, it is possible to cancel their effects.

Figure 5:
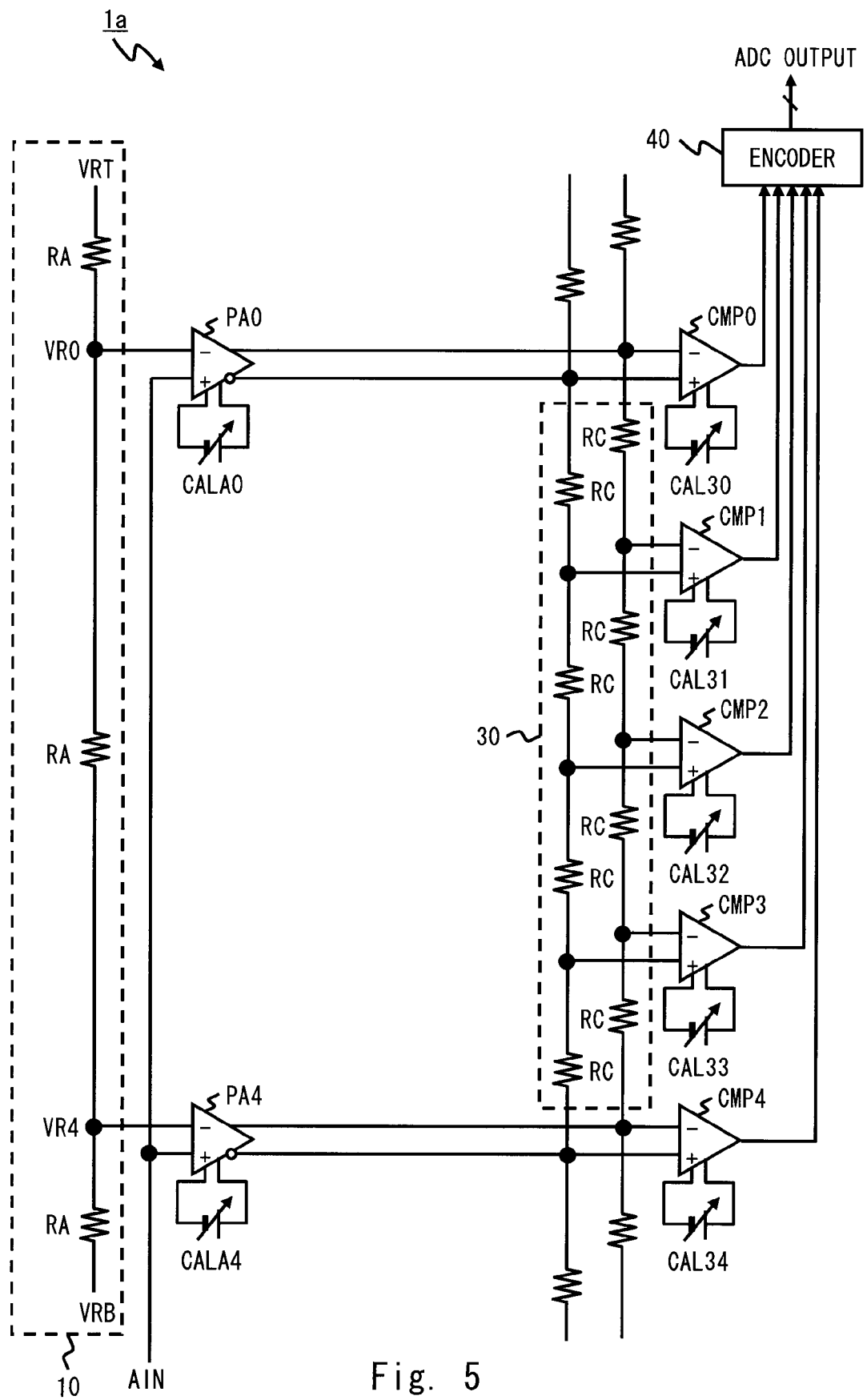
FIG. 5 is a block diagram showing an alternative example of the analog-to-digital converter according to the first exemplary embodiment.

Although the first and second preamplifiers are formed by two stages of preamplifiers in the analog-to-digital converter 1 according to the above-described exemplary embodiment, the first and second preamplifiers may be formed by one stage of preamplifier if a sufficient amplification factor can be obtained with a single preamplifier. FIG. 5 is a block diagram showing an analog-to-digital converter 1*a* as an alternative example of the analog-to-digital converter 1. Referring to FIG. 5, in the analog-to-digital converter 1*a*, the first and second preamplifiers are composed only of previous-stage preamplifier PA0 and PA4, respectively. In this alternative example, the smoothing circuit 20 can be eliminated. It is thereby possible to reduce the circuit size in the analog-to-digital converter 1*a* compared to the analog-to-digital converter 1.

Second Exemplary Embodiment

Figure 6:
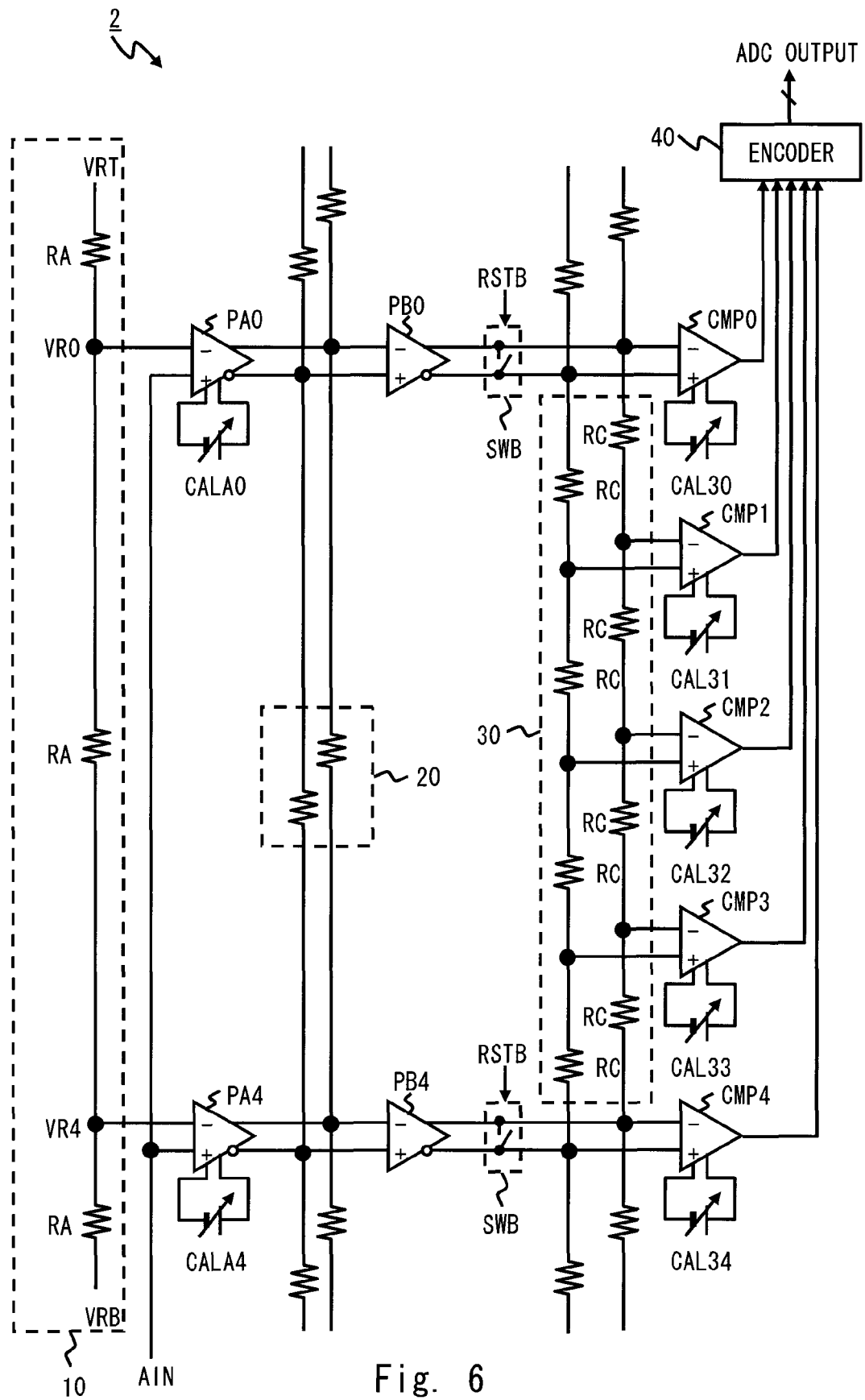
FIG. 6 is a block diagram showing an analog-to-digital converter according to a second exemplary embodiment.

FIG. 6 is a block diagram showing an analog-to-digital converter 2 according to a second exemplary embodiment of the present invention. Referring to FIG. 6, the analog-to-digital converter 2 has a structure in which switch circuits SWB are added to the analog-to-digital converter 1 according to the first exemplary embodiment. Each switch circuit SWB is placed between the outputs of the first and second preamplifiers (e.g. the outputs of the subsequent-stage preamplifier PB). The switch circuit SWB switches the connection state between the outputs of the subsequent-stage preamplifier PB according to a reset signal RSTB supplied from another circuit.

The switch circuit SWB is short-circuited during the calibration period of the analog-to-digital converter 2. Accordingly, a comparator calibration period in which a value of the analog input signal input to the comparators CMP0 to CMP4 is zero occurs during the calibration period. In the second exemplary embodiment, calibration of the comparators CMP0 to CMP4 is performed during the comparator calibration period. After the comparator calibration period ends, calibration of the preamplifiers is performed.

The operation of the analog-to-digital converter 2 during the calibration period is described hereinafter. By setting the value of the analog input signal to zero in the calibration period, the comparators CMP0 to CMP4 calculate the calibration set values of the comparators CMP0 to CMP4 during the period. Specifically, the calibration set values are set like this: the calibration set value CAL30=an input offset Off30 of the comparator CMP0, the calibration set value CAL31=an input offset Off31 of the comparator CMP1, the calibration set value CAL32=an input offset Off32 of the comparator CMP2, the calibration set value CAL33=an input offset Off33 of the comparator CMP3, and the calibration set value CAL34=an input offset Off34 of the comparator CMP4.

By setting such calibration set values, the digital values that are output from the comparators CMP0 to CMP4 during the comparator calibration period are toggled between 0 and 1.

Further, after the end of the comparator calibration period, the calibration set values for the preamplifier calibrators CALA0 and CALA4 are determined. At this time, setting for canceling the input offsets of the comparators is already made. Therefore, by applying the calibration set values CALA0 and CALA4 as represented by the following expressions (21) and (22), the input offset of the analog-to-digital converter 2 as a whole can be cancelled.

$$CALA0 = OffA0 + \frac{OffB0}{A1} \quad (21)$$

$$CALA4 = OffA4 + \frac{OffB4}{A1} \quad (22)$$

As described above, it is possible in the analog-to-digital converter 2 to simplify the calculation of the calibration set values by placing the switch circuits SWB between the outputs of the first and second preamplifiers.

Third Exemplary Embodiment

Figure 7:
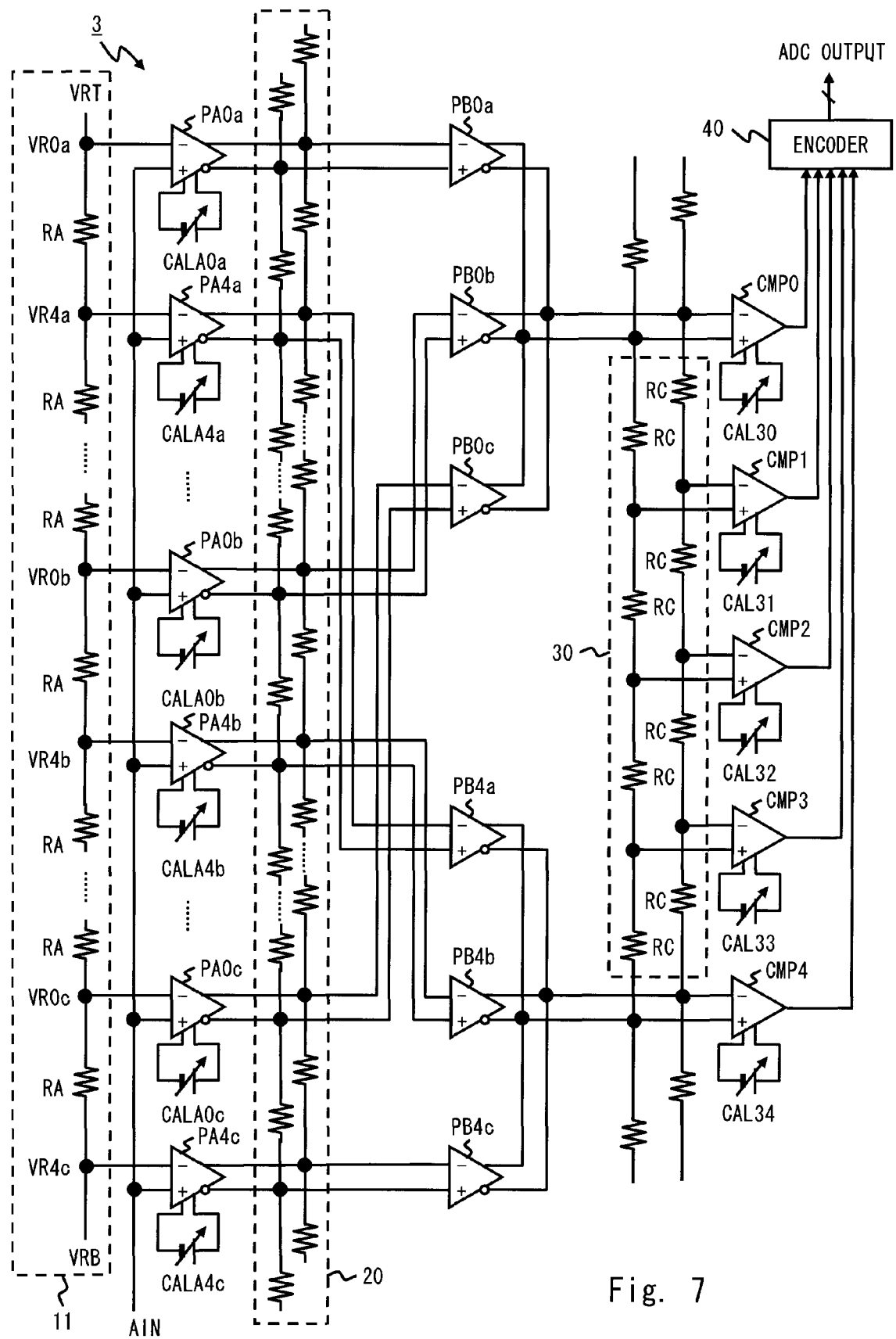
FIG. 7 is a block diagram showing an analog-to-digital converter according to a third exemplary embodiment.

FIG. 7 is a block diagram of an analog-to-digital converter 3 according to a third exemplary embodiment of the present invention. Referring to FIG. 7, in the analog-to-digital converter 3, preamplifiers with a connection in a folding scheme are used as the first and second preamplifiers. In the preamplifiers in the folding scheme (which are referred to hereinafter as folding amplifiers), outputs of a plurality of preamplifiers (three amplifiers in this exemplary embodiment) are connected together to generate one output signal. In the analog-to-digital converter 3, the number of resistors in the smoothing circuit 20 increases with an increase in the number of preamplifiers. Further, the analog-to-digital converter 3 according to the third exemplary embodiment includes a reference voltage generator 11 that generates reference voltages VR compatible with this scheme in order that the previous-stage preamplifiers generate input signals suitable for the folding amplifiers.

The first preamplifier according to the exemplary embodiment includes previous-stage preamplifiers PA0*a* to PA0*c* and subsequent-stage preamplifiers PB0*a* to PB0*c*. The previous-stage preamplifier PA0*a* and the subsequent-stage preamplifier PB0*a* form one preamplifier, the previous-stage preamplifier PA0*b* and the subsequent-stage preamplifier PB0*b* form one preamplifier, and the previous-stage preamplifier PA0*c* and the subsequent-stage preamplifier PB0*c* form one preamplifier. Those three amplifiers are connected in parallel. In the example shown in FIG. 7, the non-inverting output terminals of the odd number-th preamplifiers PB0*a* and PB0*c* are connected with the inverting output terminal of the even number-th preamplifier PB0*b*, and the inverting output terminals of the odd number-th preamplifiers PB0*a* and PB0*c* are connected with the non-inverting output terminal of the even number-th preamplifier PB0*b*. Further, separate reference voltages VR0*a* to VR0*c* and the common analog input signal AIN are respectively supplied to the three preamplifiers.

The second preamplifier according to the exemplary embodiment includes previous-stage preamplifiers PA4*a* to PA4*c* and subsequent-stage preamplifiers PB4*a* to PB4*c*. The previous-stage preamplifier PA4*a* and the subsequent-stage preamplifier PB4*a* form one preamplifier, the previous-stage preamplifier PA4*b* and the subsequent-stage preamplifier PB4*b* form one preamplifier, and the previous-stage preamplifier PA4*c* and the subsequent-stage preamplifier PB4*c* form one preamplifier. Those three amplifiers are connected in parallel. In the example shown in FIG. 7, the non-inverting output terminals of the odd number-th preamplifiers PB4*a* and PB4*c* are connected with the inverting output terminal of the even number-th preamplifier PB4*b*, and the inverting output terminals of the odd number-th preamplifiers PB4*a* and PB4*c* are connected with the non-inverting output terminal of the even number-th preamplifier PB4*b*. Further, separate reference voltages VR4a to VR4c and the common analog input signal AIN are respectively supplied to the three preamplifiers.

In the case of using the folding amplifiers, the analog-to-digital converter 3 according to the exemplary embodiment generates a 5-bit digital value for a high-potential signal when activating the subsequent-stage preamplifiers PB0a and PB4a, generates a 5-bit digital value for an intermediate-potential signal when activating the subsequent-stage preamplifiers PB0b and PB4b, and generates a 5-bit digital value for a low-potential signal when activating the subsequent-stage preamplifiers PB0c and PB4c. Therefore, the use of the folding amplifiers enables obtaining conversion results having an equal resolution with a smaller number of comparators.

The calibration set values in the analog-to-digital converter 3 are described hereinbelow. The input-referred offsets InOff30 to InOff34 of the analog-to-digital converter corresponding to the transition of the comparators CMP0 to CMP4 have different values according to the activation state of the preamplifiers. For example, the input-referred offsets of the analog-to-digital converter corresponding to the transition of the comparators CMP0 to CMP4 when the subsequent-stage preamplifiers PB0a and PB4a are activated are represented by the following expressions (23) to (27). In the expressions (23) to (27), OffA0a indicates the input offset of the previous-stage preamplifier PA0a, CALA0a indicates the calibration set value of the preamplifier calibrator CALA0a, OffA4a indicates the input offset of the previous-stage preamplifier PA4a, and CALA4a indicates the calibration set value of the preamplifier calibrator CALA4a.

$$InOff30 = (OffA0a - CALA0a) + \frac{OffB0a}{A1} + \frac{Off30 - CAL30}{A1 \times A2} \quad (23)$$

$$InOff31 = \frac{\left(\left(\begin{array}{c}OffA0a-\\CALA0a\end{array}\right) + \frac{OffB0a}{A1}\right) \times 3 + \left(\left(\begin{array}{c}OffA4a-\\CALA4a\end{array}\right) + \frac{OffB4a}{A1}\right)}{4} + \frac{Off31 - CAL31}{A1 \times A2} \quad (24)$$

$$InOff32 = \frac{\left(\left(\begin{array}{c}OffA0a-\\CALA0a\end{array}\right) + \frac{OffB0a}{A1}\right) + \left(\left(\begin{array}{c}OffA4a-\\CALA4a\end{array}\right) + \frac{OffB4a}{A1}\right)}{2} + \frac{Off32 - CAL32}{A1 \times A2} \quad (25)$$

$$InOff33 = \frac{\left(\left(\begin{array}{c}OffA0a-\\CALA0a\end{array}\right) + \frac{OffB0a}{A1}\right) + \left(\left(\begin{array}{c}OffA4a-\\CALA4a\end{array}\right) + \frac{OffB4a}{A1}\right) \times 3}{4} + \frac{Off33 - CAL33}{A1 \times A2} \quad (26)$$

$$InOff34 = (OffA4a - CALA4a) + \frac{OffB4a}{A1} + \frac{Off34 - CAL34}{A1 \times A2} \quad (27)$$

Further, the input-referred offsets of the analog-to-digital converter corresponding to the transition of the comparators CMP0 to CMP4 when the subsequent-stage preamplifiers PB0b and PB4b are activated are represented by the following expressions (28) to (32). In the expressions (28) to (32), OffA0b indicates the input offset of the previous-stage preamplifier PA0b, CALA0b indicates the calibration set value of the preamplifier calibrator CALA0b, OffA4b indicates the input offset of the previous-stage preamplifier PA4b, and CALA4b indicates the calibration set value of the preamplifier calibrator CALA4b.

$$InOff30 = (OffA0b - CALA0b) + \frac{OffB0b}{A1} + \frac{Off30 - CAL30}{A1 \times A2} \quad (28)$$

$$InOff31 = \frac{\left(\left(\begin{array}{c}OffA0b-\\CALA0b\end{array}\right) + \frac{OffB0b}{A1}\right) \times 3 + \left(\left(\begin{array}{c}OffA4b-\\CALA4b\end{array}\right) + \frac{OffB4b}{A1}\right)}{4} + \frac{Off31 - CAL31}{A1 \times A2} \quad (29)$$

$$InOff32 = \frac{\left(\left(\begin{array}{c}OffA0b-\\CALA0b\end{array}\right) + \frac{OffB0b}{A1}\right) + \left(\left(\begin{array}{c}OffA4b-\\CALA4b\end{array}\right) + \frac{OffB4b}{A1}\right)}{2} + \frac{Off32 - CAL32}{A1 \times A2} \quad (30)$$

$$InOff33 = \frac{\left(\left(\begin{array}{c}OffA0b-\\CALA0b\end{array}\right) + \frac{OffB0b}{A1}\right) + \left(\left(\begin{array}{c}OffA4b-\\CALA4b\end{array}\right) + \frac{OffB4b}{A1}\right) \times 3}{4} + \frac{Off33 - CAL33}{A1 \times A2} \quad (31)$$

$$InOff34 = (OffA4b - CALA4b) + \frac{OffB4b}{A1} + \frac{Off34 - CAL34}{A1 \times A2} \quad (32)$$

Furthermore, the input-referred offsets of the analog-to-digital converter corresponding to the transition of the comparators CMP0 to CMP4 when the subsequent-stage preamplifiers PB0c and PB4c are activated are represented by the following expressions (33) to (37). In the expressions (33) to (37), OffA0c indicates the input offset of the previous-stage preamplifier PA0c, CALA0c indicates the calibration set value of the preamplifier calibrator CALA0c, OffA4c indicates the input offset of the previous-stage preamplifier PA4c, and CALA4c indicates the calibration set value of the preamplifier calibrator CALA4c.

$$InOff30 = (OffA0c - CALA0c) + \frac{OffB0c}{A1} + \frac{Off30 - CAL30}{A1 \times A2} \quad (33)$$

$$InOff31 = \frac{\left(\left(\begin{array}{c}OffA0c-\\CALA0c\end{array}\right) + \frac{OffB0c}{A1}\right) \times 3 + \left(\left(\begin{array}{c}OffA4c-\\CALA4c\end{array}\right) + \frac{OffB4b}{A1}\right)}{4} + \frac{Off31 - CAL31}{A1 \times A2} \quad (34)$$

$$InOff32 = \frac{\left(\left(\begin{array}{c}OffA0c-\\CALA0c\end{array}\right) + \frac{OffB0c}{A1}\right) + \left(\left(\begin{array}{c}OffA4c-\\CALA4c\end{array}\right) + \frac{OffB4c}{A1}\right)}{2} + \frac{Off32 - CAL32}{A1 \times A2} \quad (35)$$

$$InOff33 = \frac{\left(\left(\begin{array}{c}OffA0c-\\CALA0c\end{array}\right) + \frac{OffB0b}{A1}\right) + \left(\left(\begin{array}{c}OffA4c-\\CALA4c\end{array}\right) + \frac{OffB4b}{A1}\right) \times 3}{4} + \frac{Off33 - CAL33}{A1 \times A2} \quad (36)$$

$$InOff34 = (OffA4c - CALA4c) + \frac{OffB4c}{A1} + \frac{Off34 - CAL34}{A1 \times A2} \quad (37)$$

In this exemplary embodiment, the calibration set value CAL30 of the comparator calibrator CAL30 placed corresponding to the comparator CMP0 to which the first output signal is input from the first preamplifier is zero. Further, the calibration set value CAL34 of the comparator calibrator CAL34 placed corresponding to the comparator CMP4 to which the second output signal is input from the second preamplifier is zero. If the expressions (23) to (37) are solved by setting the input-referred offsets of the analog-to-digital converter corresponding to the transition of all the comparators to zero, the calibration set values CALA0, CALA4 and CAL31 to CAL33 are represented by the following expressions (38) to (46).

$$CALA0a = OffA0a + \frac{OffB0a}{A1} + \frac{Off30}{A1 \times A2} \quad (38)$$

$$CALA0b = OffA0b + \frac{OffB0b}{A1} + \frac{Off30}{A1 \times A2} \quad (39)$$

$$CALA0c = OffA0c + \frac{OffB0c}{A1} + \frac{Off30}{A1 \times A2} \quad (40)$$

$$CALA4a = OffA4a + \frac{OffB4a}{A1} + \frac{Off34}{A1 \times A2} \quad (41)$$

$$CALA4b = OffA4b + \frac{OffB4b}{A1} + \frac{Off34}{A1 \times A2} \quad (42)$$

$$CALA4c = OffA4c + \frac{OffB4c}{A1} + \frac{Off34}{A1 \times A2} \quad (43)$$

$$CAL31 = \frac{-3Off30 + 4Off31 - Off34}{4} \quad (44)$$

$$CAL32 = \frac{-Off30 + 2Off32 - Off34}{2} \quad (45)$$

$$CAL33 = \frac{-Off30 + 4Off32 - 3Off34}{4} \quad (46)$$

As described above, the calibration set values as shown in the expressions (38) to (46) can be obtained also in the analog-to-digital converter 3 that includes preamplifiers configured in the folding scheme. In the calibration set values represented by the expressions (38) to (46) as well, there is no term that has the amplification factors A1 and A2 as multiplicands. Therefore, it is possible in the analog-to-digital converter 3, as in the analog-to-digital converter 1 according to the first exemplary embodiment, to eliminate the effect of the input offsets on the digital values as output results and improve the linearity of the digital values.

Figure 8:
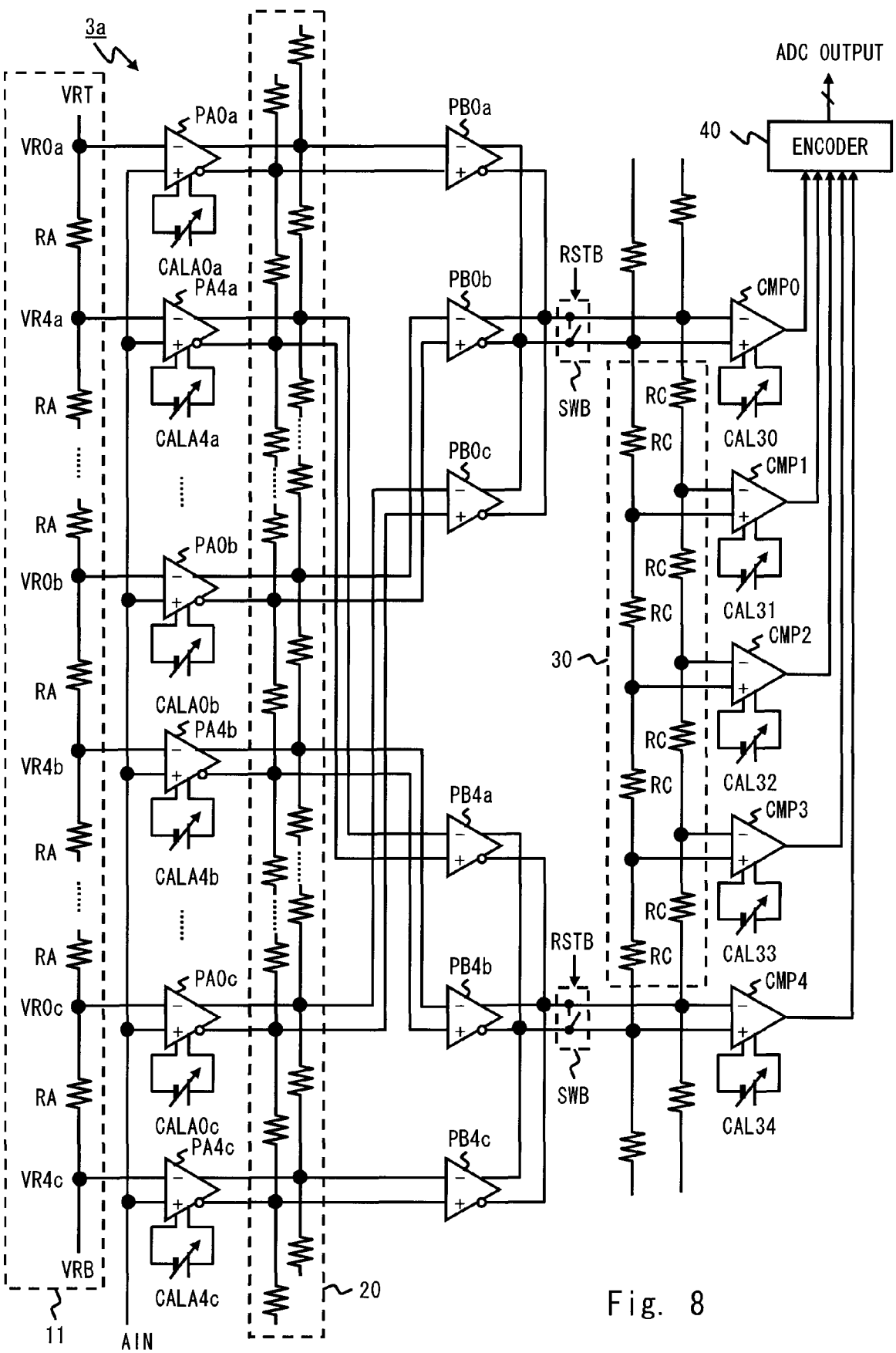
FIG. 8 is a block diagram showing an alternative example of the analog-to-digital converter according to the third exemplary embodiment.

FIG. 8 shows an analog-to-digital converter 3a, which is an alternative example of the analog-to-digital converter 3. As shown in FIG. 8, the analog-to-digital converter 3a has a structure in which the switch circuits SWB that are described in the second exemplary embodiment are added to the analog-to-digital converter 3. By adding the switch circuits SWB, it is possible to simplify the calculation of the calibration set values in the same manner as in the second exemplary embodiment.

Fourth Exemplary Embodiment

In a fourth exemplary embodiment, another method of calculating the calibration set values in the analog-to-digital converter 3 according to the third exemplary embodiment is described. In the fourth exemplary embodiment also, the input-referred offsets of the analog-to-digital converter corresponding to the transition of the comparators CMP0 to CMP4 are represented by the above expressions (23) to (37). In the fourth exemplary embodiment, however, the conditions represented by the following expressions (47) and (48) are given to the calibration set values CALA0a to CALA0c and CALA4a to CALA4c that are supplied to the preamplifier calibrators CALA0a to CALA0c and CALA4a to CALA4c.

$$CALA0a + CALA0b + CALA0c = 0 \quad (47)$$

$$CALA4a + CALA4b + CALA4c = 0 \quad (48)$$

Further, in this exemplary embodiment, an average value OffP0 of the input-referred offsets of the previous-stage preamplifiers PA0a to PA0c and the subsequent-stage preamplifiers PB0a to PB0c is represented by the following expression (49), and an average value OffP4 of the input-referred offsets of the previous-stage preamplifiers PA4a to PA4c and the subsequent-stage preamplifiers PB4a to PB4c is represented by the following expression (50)

$$OffP0 = \frac{OffP0a + OffP0b + OffP0c}{3} \quad (49)$$

$$= \frac{OffA0a + OffA0b + OffA0c}{3} + \frac{OffB0a + OffB0b + OffB0c}{3 \times A1}$$

$$OffP4 = \frac{OffP4a + OffP4b + OffP4c}{3} \quad (50)$$

$$= \frac{OffA4a + OffA4b + OffA4c}{3} + \frac{OffB4a + OffB4b + OffB4c}{3 \times A1}$$

The input-referred offsets InOff30 to InOff34 of the analog-to-digital converter corresponding to the transition of the comparators CMP0 to CMP4 are represented by the following expressions (51) to (55). In the expressions (51) to (55), the input-referred offsets InOff30 to InOff34 are zero because the offsets of the analog-to-digital converter 3 can be cancelled by setting the values of the expressions (51) to (55) to all zero.

$$InOff30 = OffP0 + \frac{Off30 - CAL30}{A1 \times A2} = 0 \quad (51)$$

$$InOff31 = \frac{3OffP0}{4} + \frac{OffP4}{4} + \frac{Off31 - CAL31}{A1 \times A2} = 0 \quad (52)$$

$$InOff32 = \frac{OffP0}{2} + \frac{OffP4}{2} + \frac{Off32 - CAL32}{A1 \times A2} = 0 \quad (53)$$

$$InOff33 = \frac{OffP0}{4} + \frac{3OffP4}{4} + \frac{Off33 - CAL33}{A1 \times A2} = 0 \quad (54)$$

$$InOff34 = OffP4 + \frac{Off34 - CAL34}{A1 \times A2} = 0 \quad (55)$$

If the expressions (47) to (55) are solved, the calibration set values can be represented by the following expressions (56) to (66).

$$CAL30 = Off30 + A1 \times A2 \times \frac{OffA0a + OffA0b + OffA0c}{3} + \quad (56)$$
$$A2 \times \frac{OffB0a + OffB0b + OffB0c}{3}$$

$$CAL31 = Off31 + \frac{3}{4} \times \left( \begin{array}{c} A1 \times A2 \times \frac{OffA0a + OffA0b + OffA0c}{3} + \\ A2 \times \frac{OffB0a + OffB0b + OffB0c}{3} \end{array} \right) + \quad (57)$$

$$\frac{1}{4} \times \left( \begin{array}{c} A1 \times A2 \times \frac{OffA4a + OffA4b + OffA4c}{3} + \\ OffB4a + OffB4b + OffB4c \\ \hline 3 \end{array} \right)$$

-continued $$CAL32 = Off32 + \frac{1}{2} \times \left( \begin{array}{c} A1 \times A2 \times \frac{OffA0a + OffA0b + OffA0c}{3} + \\ A2 \times \frac{OffB0a + OffB0b + OffB0c}{3} \end{array} \right) + \quad (58)$$

$$\frac{1}{2} \times \left( \begin{array}{c} A1 \times A2 \times \frac{OffA4a + OffA4b + OffA4c}{3} + \\ \frac{OffB4a + OffB4b + OffB4c}{3} \end{array} \right)$$

$$CAL33 = Off33 + \frac{1}{4} \times \left( \begin{array}{c} A1 \times A2 \times \frac{OffA0a + OffA0b + OffA0c}{3} + \\ A2 \times \frac{OffB0a + OffB0b + OffB0c}{3} \end{array} \right) + \quad (59)$$

$$\frac{3}{4} \times \left( \begin{array}{c} A1 \times A2 \times \frac{OffA4a + OffA4b + OffA4c}{3} + \\ \frac{OffB4a + OffB4b + OffB4c}{3} \end{array} \right)$$

$$CAL34 = Off34 + A1 \times A2 \times \frac{OffA4a + OffA4b + OffA4c}{3} + \quad (60)$$
$$A2 \times \frac{OffB4a + OffB4b + OffB4c}{3}$$

$$CALA0a = \frac{1}{3}\left(\frac{2 \times OffA0c -}{OffA0b - OffA0c}\right) + \frac{1}{A1}\left(\frac{2 \times OffB0a -}{OffB0b - OffB0c}\right) \quad (61)$$

$$CALA0b = \frac{1}{3}\left(\frac{-OffA0c - 2 \times}{OffA0b - OffA0c}\right) + \frac{1}{A1}\left(\frac{-OffB0a - 2 \times}{OffB0b - OffB0c}\right) \quad (62)$$

$$CALA0c = \frac{1}{3}\left(\frac{-OffA0c -}{OffA0b - 2 \times OffA0c}\right) + \frac{1}{A1}\left(\frac{-OffB0a -}{OffB0b - 2 \times OffB0c}\right) \quad (63)$$

$$CALA4a = \frac{1}{3}\left(\frac{2 \times OffA4c -}{OffA4b - OffA4c}\right) + \frac{1}{A1}\left(\frac{2 \times OffB4a -}{OffB4b - OffB4c}\right) \quad (64)$$

$$CALA4b = \frac{1}{3}\left(\frac{-OffA4c - 2 \times}{OffA4b - OffA4c}\right) + \frac{1}{A1}\left(\frac{-OffB4a - 2 \times}{OffB4b - OffB4c}\right) \quad (65)$$

$$CALA4c = \frac{1}{3}\left(\frac{-OffA4c -}{OffA4b - 2 \times OffA4c}\right) + \frac{1}{A1}\left(\frac{-OffB4a -}{OffB4b - 2 \times OffB4c}\right) \quad (66)$$

As described above, the method of calculating the calibration set values according to the fourth exemplary embodiment calculates the calibration set values under the conditions represented by the expressions (47) and (48), thereby uniquely determining each calibration set value even if calibration of offsets is performed by the comparator calibrators CAL30 and CAL34. It is thereby possible to easily derive a plurality of calibration set values, which enables reduction of the time to calculate the calibration set values.

Fifth Exemplary Embodiment

Figure 9:
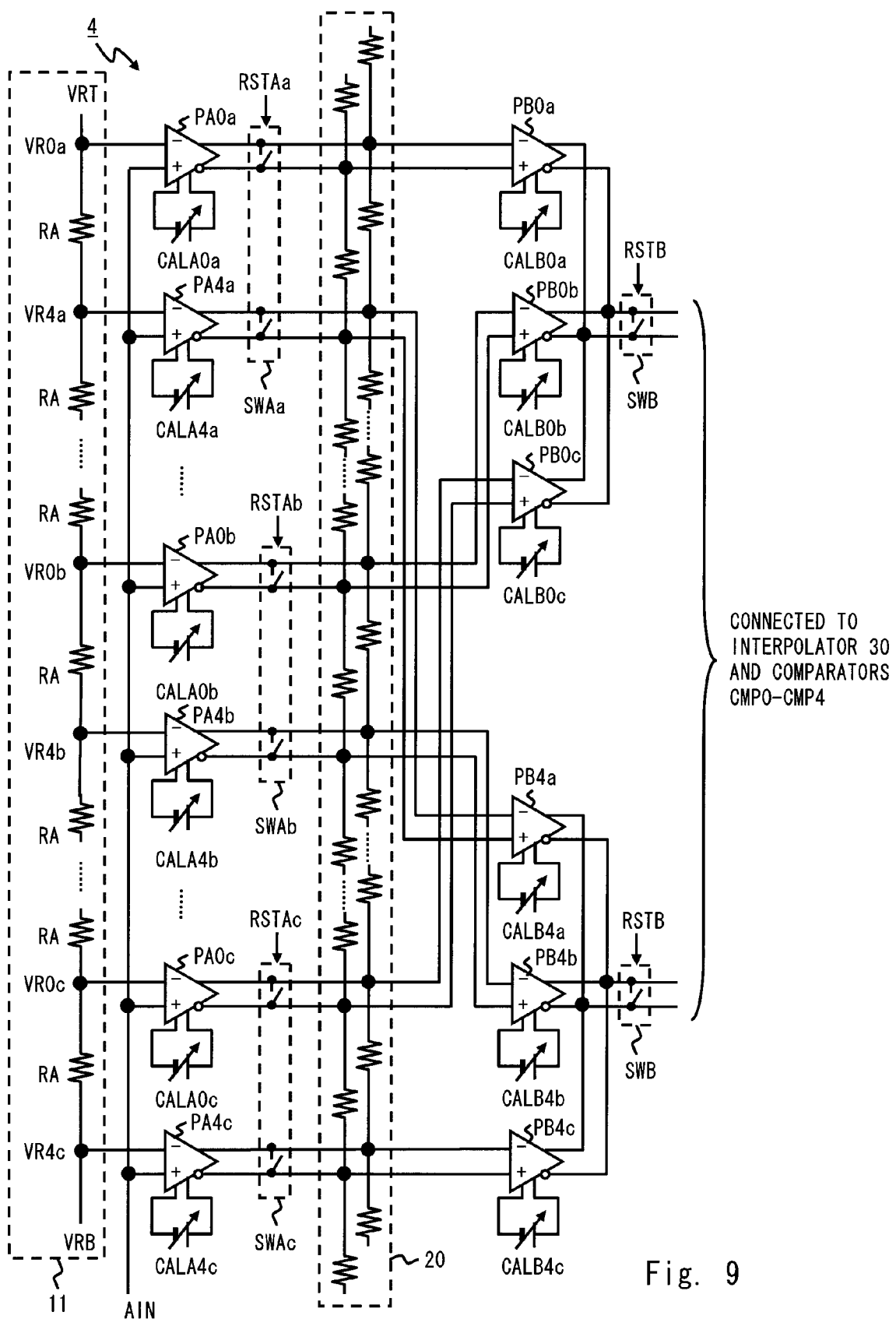
FIG. 9 is a block diagram showing an analog-to-digital converter according to a fifth exemplary embodiment.

FIG. 9 is a block diagram of an analog-to-digital converter 4 according to a fifth exemplary embodiment of the present invention. Referring to FIG. 9, the analog-to-digital converter 4 according to the fifth exemplary embodiment has a structure in which switch circuits SWA and preamplifier calibrators CALB are added to the previous-stage preamplifiers in the alternative example (the analog-to-digital converter 3*a*) of the analog-to-digital converter 3 according to the third exemplary embodiment. The switch circuits SWA include switch circuits SWAa to SWAc with different control timing.

The switch circuit SWAa is placed between the outputs of the preamplifiers PA0*a* and PA4*a*, which correspond to the first amplifier of the folding amplifiers. The switch circuit SWAb is placed between the outputs of the preamplifiers PA0*b* and PA4*b*, which correspond to the second amplifier of the folding amplifiers. The switch circuit SWAc is placed between the outputs of the preamplifiers PA0*c* and PA4*c*, which correspond to the third amplifier of the folding amplifiers.

Figure 10:
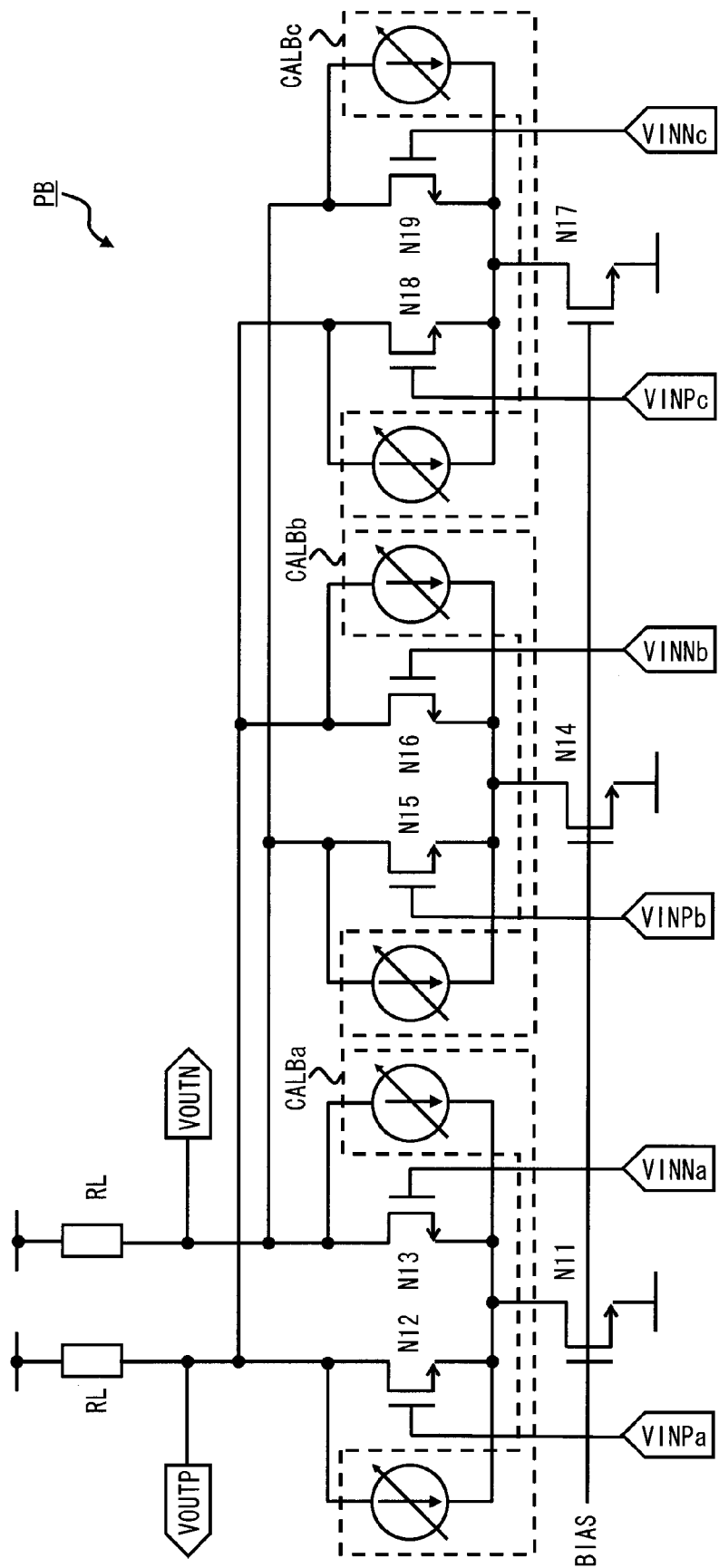
FIG. 10 is a circuit diagram showing a subsequent-stage preamplifier and a preamplifier calibrator according to the fifth exemplary embodiment.

Further, the preamplifier calibrator CALB is placed corresponding to each of the preamplifiers constituting the folding amplifiers. In FIG. 9, a preamplifier calibrator CALB0*a* is placed corresponding to the subsequent-stage preamplifier PB0*a*, a preamplifier calibrator CALB0*b* is placed corresponding to the subsequent-stage preamplifier PB0*b*, and a preamplifier calibrator CALB0*c* is placed corresponding to the subsequent-stage preamplifier PB0*c*. Further, a preamplifier calibrator CALB4*a* is placed corresponding to the subsequent-stage preamplifier PB4*a*, a preamplifier calibrator CALB4*b* is placed corresponding to the subsequent-stage preamplifier PB4*b*, and a preamplifier calibrator CALB4*c* is placed corresponding to the subsequent-stage preamplifier PB4*c*. FIG. 10 is a circuit diagram of the folding amplifiers including the preamplifier calibrators CALB.

Referring to FIG. 10, the folding amplifier PB includes NMOS transistors N11 to N19 and load resistors RL. In the folding amplifier PB, the NMOS transistors N12 and N13 form a differential pair of the 1st preamplifier, and the NMOS transistor N11 supplies a current to the differential pair formed by the NMOS transistors N12 and N13. The gate of the NMOS transistor N12 is the non-inverting input terminal of the 1st preamplifier, and the gate of the NMOS transistor N13 is the inverting input terminal of the 1st preamplifier. The NMOS transistors N15 and N16 form a differential pair of the 2nd preamplifier, and the NMOS transistor N14 supplies a current to the differential pair formed by the NMOS transistors N15 and N16. The gate of the NMOS transistor N15 is the non-inverting input terminal of the 2nd preamplifier, and the gate of the NMOS transistor N16 is the inverting input terminal of the 2nd preamplifier. The NMOS transistors N18 and N19 form a differential pair of the 3rd preamplifier, and the NMOS transistor N17 supplies a current to the differential pair formed by the NMOS transistors N18 and N19. The gate of the NMOS transistor N18 is the non-inverting input terminal of the 3rd preamplifier, and the gate of the NMOS transistor N19 is the inverting input terminal of the 3rd preamplifier.

The drains of the NMOS transistors N12, N16 and N18 are connected to one end of the load resistor RL. The drains of the NMOS transistors N13, N15 and N19 are connected to one end of the other load resistor RL. The other ends of the two load resistors RL are connected to power supply terminals. The drains of the NMOS transistors N12, N16 and N18 serve as the non-inverting output terminal of the folding amplifier PB, and the drains of the NMOS transistors N13, N15 and N19 serve as the inverting output terminal of the folding amplifier PB.

The preamplifier calibrator CALB is placed corresponding to each of the preamplifiers constituting the folding amplifier PB. The preamplifier calibrator includes two variable current sources that are connected in parallel to the respective transistors forming the differential pair of the preamplifiers. The preamplifier calibrator CALB adjusts currents to flow into the load resistors RL according to values of currents output from the variable current sources, thereby canceling the offset of the preamplifier PB. Thus, in the preamplifier calibrator CALB, the value of the current to be output is adjusted based on the calibration set value.

The calibration set values in the analog-to-digital converter 4 are described hereinbelow. The input-referred offsets InOff30 to InOff34 of the analog-to-digital converter corresponding to the transition of the comparators CMP0 to CMP4 have different values according to the activation state of the preamplifiers. For example, the subsequent-stage preamplifiers PB0a and PB4a are activated when input signals AIN respectively having voltage levels close to reference voltages VREFA0a and VREFA4a are input. The input-referred offsets of the analog-to-digital converter corresponding to the transition of the comparators CMP0 to CMP4 in this case are represented by the following expressions (67) to (71). In the expressions (67) to (71), OffA0a indicates the input offset of the previous-stage preamplifier PA0a, CALA0a indicates the calibration set value of the preamplifier calibrator CALA0a, OffA4a indicates the input offset of the previous-stage preamplifier PA4a, and CALA4a indicates the calibration set value of the preamplifier calibrator CALA4a. Further, OffB0a indicates the input offset of the subsequent-stage preamplifier PB0a, CALB0a indicates the calibration set value of the preamplifier calibrator CALB0a, OffB4a indicates the input offset of the subsequent-stage preamplifier PB4a, and CALB4a indicates the calibration set value of the preamplifier calibrator CALB4a.

$$InOff30 = \left(\frac{OffA0a-}{CALA0a}\right) + \frac{OffB0a-CALB0a}{A1} + \frac{Off30-CAL30}{A1 \times A2} \quad (67)$$

$$InOff31 = \frac{\left(\left(\frac{OffA0a-}{CALA0a}\right)+\frac{OffB0a-}{CALB0a}\right)}{4} \times 3 + \frac{\left(\left(\frac{OffA4a-}{CALA4a}\right)+\frac{OffB4a-}{CALB4a}\right)}{4} + \frac{Off31-CAL31}{A1 \times A2} \quad (68)$$

$$InOff32 = \frac{\left(\left(\frac{OffA0a-}{CALA0a}\right)+\frac{OffB0a-}{CALB0a}\right)}{2} + \frac{\left(\left(\frac{OffA4a-}{CALA4a}\right)+\frac{OffB4a-}{CALB4a}\right)}{2} + \frac{Off32-CAL32}{A1 \times A2} \quad (69)$$

$$InOff33 = \frac{\left(\left(\frac{OffA0a-}{CALA0a}\right)+\frac{OffB0a-}{CALB0a}\right)}{4} + \frac{\left(\left(\frac{OffA4a-}{CALA4a}\right)+\frac{OffB4a-}{CALB4a}\right)}{4} \times 3 + \frac{Off33-CAL33}{A1 \times A2} \quad (70)$$

$$InOff34 = \left(\frac{OffA4a-}{CALA4a}\right) + \frac{OffB4a-CALB4a}{A1} + \frac{Off34-CAL34}{A1 \times A2} \quad (71)$$

Further, the subsequent-stage preamplifiers PB0b and PB4b are activated when input signals AIN respectively having voltage levels close to reference voltages VREFA0b and VREFA4b are input. The input-referred offsets of the analog-to-digital converter corresponding to the transition of the comparators CMP0 to CMP4 in this case are represented by the following expressions (72) to (76). In the expressions (72) to (76), OffA0b indicates the input offset of the previous-stage preamplifier PA0b, CALA0b indicates the calibration set value of the preamplifier calibrator CALA0b, OffA4b indicates the input offset of the previous-stage preamplifier PA4b, and CALA4b indicates the calibration set value of the preamplifier calibrator CALA4b. Further, OffB0b indicates the input offset of the subsequent-stage preamplifier PB0b, CALB0b indicates the calibration set value of the preamplifier calibrator CALB0b, OffB4b indicates the input offset of the subsequent-stage preamplifier PB4b, and CALB4b indicates the calibration set value of the preamplifier calibrator CALB4b.

$$InOff30 = \left(\frac{OffA0b-}{CALA0b}\right) + \frac{OffB0b-CALB0b}{A1} + \frac{Off30-CAL30}{A1 \times A2} \quad (72)$$

$$InOff31 = \frac{\left(\left(\frac{OffA0b-}{CALA0b}\right)+\frac{OffB0b-}{CALB0b}\right)}{4} \times 3 + \frac{\left(\left(\frac{OffA4b-}{CALA4b}\right)+\frac{OffB4b-}{CALB4b}\right)}{4} + \frac{Off31-CAL31}{A1 \times A2} \quad (73)$$

$$InOff32 = \frac{\left(\left(\frac{OffA0b-}{CALA0b}\right)+\frac{OffB0b-}{CALB0b}\right)}{2} + \frac{\left(\left(\frac{OffA4b-}{CALA4b}\right)+\frac{OffB4b-}{CALB4b}\right)}{2} + \frac{Off32-CAL32}{A1 \times A2} \quad (74)$$

$$InOff33 = \frac{\left(\left(\frac{OffA0b-}{CALA0b}\right)+\frac{OffB0b-}{CALB0b}\right)}{4} + \frac{\left(\left(\frac{OffA4b-}{CALA4b}\right)+\frac{OffB4b-}{CALB4b}\right)}{4} \times 3 + \frac{Off33-CAL33}{A1 \times A2} \quad (75)$$

$$InOff34 = \left(\frac{OffA4b-}{CALA4b}\right) + \frac{OffB4b-CALB4b}{A1} + \frac{Off34-CAL34}{A1 \times A2} \quad (76)$$

Further, the subsequent-stage preamplifiers PB0c and PB4c are activated when input signals AIN respectively having voltage levels close to reference voltages VREFA0c and VREFA4c are input. The input-referred offsets of the analog-to-digital converter corresponding to the transition of the comparators CMP0 to CMP4 in this case are represented by the following expressions (77) to (81). In the expressions (77) to (81), OffA0c indicates the input offset of the previous-stage preamplifier PA0c, CALA0c indicates the calibration set value of the preamplifier calibrator CALA0c, OffA4c indicates the input offset of the previous-stage preamplifier PA4c, and CALA4c indicates the calibration set value of the preamplifier calibrator CALA4c. Further, OffB0c indicates the input offset of the subsequent-stage preamplifier PB0c, CALB0c indicates the calibration set value of the preamplifier calibrator CALB0c, OffB4c indicates the input offset of the subsequent-stage preamplifier PB4c, and CALB4c indicates the calibration set value of the preamplifier calibrator CALB4c.

$$InOff30 = \left(\frac{OffA0c-}{CALA0c}\right) + \frac{OffB0c - CALB0c}{A1} + \frac{Off30 - CAL30}{A1 \times A2} \qquad (77)$$

$$InOff31 = \frac{\left(\left(\frac{OffA0c-}{CALA0c}\right)+\frac{OffB0c-}{CALB0c}\right)\times 3}{4} + \frac{\left(\left(\frac{OffA4c-}{CALA4c}\right)+\frac{OffB4c-}{CALB4c}\right)}{4} + \frac{Off31 - CAL31}{A1 \times A2} \qquad (78)$$

$$InOff32 = \frac{\left(\left(\frac{OffA0c-}{CALA0c}\right)+\frac{OffB0c-}{CALB0c}\right)}{2} + \frac{\left(\left(\frac{OffA4c-}{CALA4c}\right)+\frac{OffB4c-}{CALB4c}\right)}{2} + \frac{Off32 - CAL32}{A1 \times A2} \qquad (79)$$

$$InOff33 = \frac{\left(\left(\frac{OffA0c-}{CALA0c}\right)+\frac{OffB0c-}{CALB0c}\right)}{4} + \frac{\left(\left(\frac{OffA4c-}{CALA4c}\right)+\frac{OffB4c-}{CALB4c}\right)\times 3}{4} + \frac{Off33 - CAL33}{A1 \times A2} \qquad (80)$$

$$InOff34 = \left(\frac{OffA4c-}{CALA4c}\right) + \frac{OffB4c - CALB4c}{A1} + \frac{Off34 - CAL34}{A1 \times A2} \qquad (81)$$

In the analog-to-digital converter 4 according to the fifth exemplary embodiment, as in the analog-to-digital converter 2 according to the second exemplary embodiment, the switch circuit placed in the previous stage of the comparator or the preamplifier for which the calibration set value is to be set is turned on. At this time, because the switch circuits are placed in a plurality of stages in the analog-to-digital converter 4 according to the fifth exemplary embodiment, calibration is performed according to the flowchart shown in FIG. 11.

Figure 11:
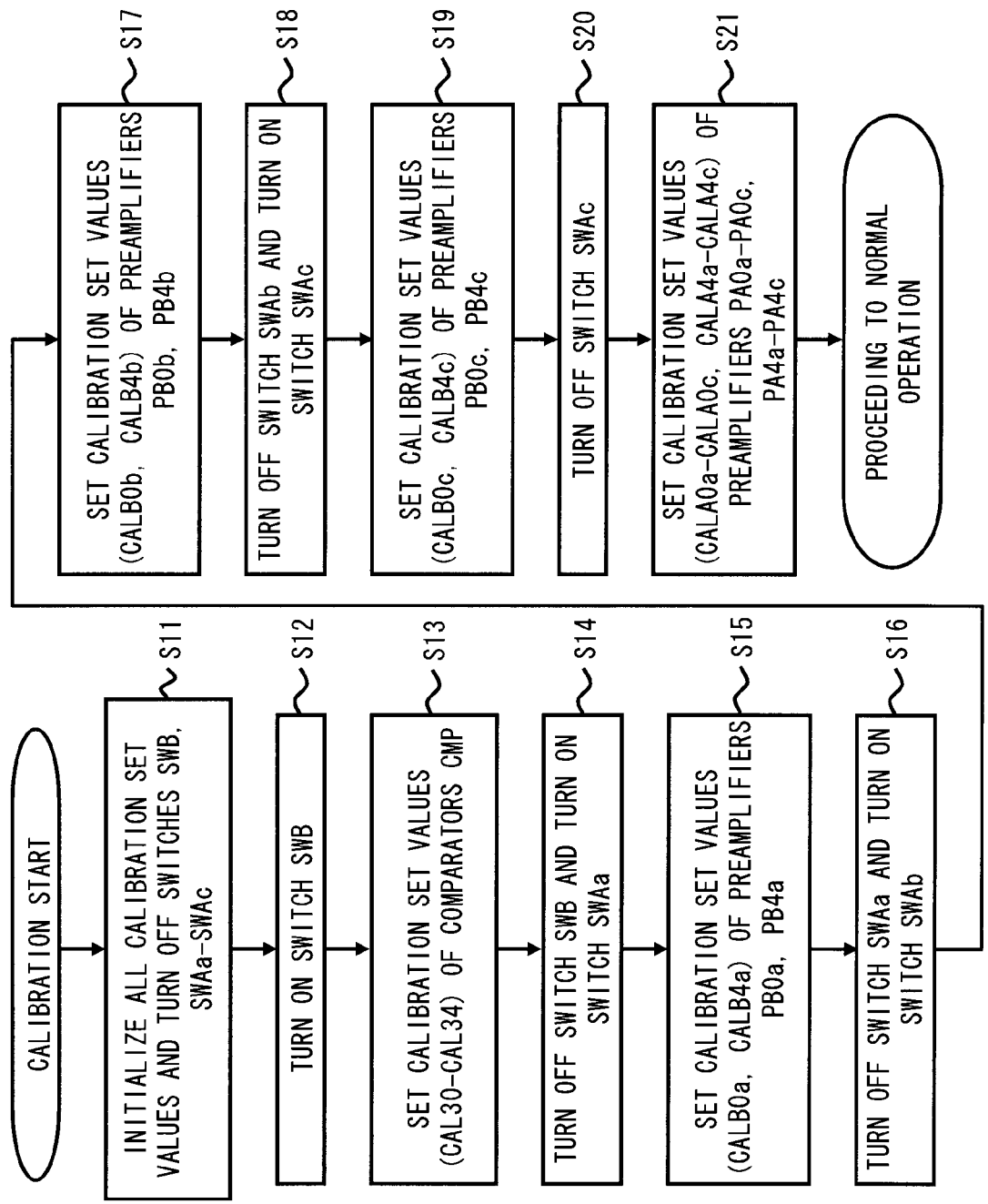
FIG. 11 is a flowchart showing a procedure of setting calibration set values in the analog-to-digital converter according to the fifth exemplary embodiment.

Referring to FIG. 11, in the analog-to-digital converter 4, all calibration set values are initialized at the start of calibration. Further, the switch circuits SWB and SWAa to SWAc are turned off (step S11). Next, the switch circuits SWB are turned on (step S12). The non-inverting input terminals and the inverting input terminals of the comparators CMP0 to CMP4 thereby become the same potential. In this state, the calibration set values of the comparator calibrators CAL30 to CAL34 corresponding to the comparators CMP0 to CMP4 are controlled. The calibration set values are set in such a way that the outputs of the comparators CMP0 to CMP4 are toggled between High level and Low level (step S13).

Next, the switch circuits SWB are turned off, and the switch circuit SWAa is turned on (step S14). The non-inverting input terminals and the inverting input terminals of the 1st preamplifiers (the preamplifier PB0a and the preamplifier PB4a in FIG. 9) of the folding amplifiers thereby become the same potential. Then, the calibration set values of the preamplifier calibrators CALB0a and CALB4a corresponding to the preamplifiers PB0a and PB4a are controlled. The calibration set values of the preamplifier calibrators CALB0a and CALB4a are set in such a way that the outputs of the comparators CMP0 to CMP4 are toggled between High level and Low level (step S15).

Then, the switch circuit SWAa is turned off, and the switch circuit SWAb is turned on (step S16). The non-inverting input terminals and the inverting input terminals of the 2nd preamplifiers (the preamplifier PB0b and the preamplifier PB4b in FIG. 9) of the folding amplifiers thereby become the same potential. Then, the calibration set values of the preamplifier calibrators CALB0b and CALB4b corresponding to the preamplifiers PB0b and PB4b are controlled. The calibration set values of the preamplifier calibrators CALB0b and CALB4b are set in such a way that the outputs of the comparators CMP0 to CMP4 are toggled between High level and Low level (step S17).

Further, the switch circuit SWAb is turned off, and the switch circuit SWAc is turned on (step S18). The non-inverting input terminals and the inverting input terminals of the 3rd preamplifiers (the preamplifier PB0c and the preamplifier PB4c in FIG. 9) of the folding amplifiers thereby become the same potential. Then, the calibration set values of the preamplifier calibrators CALB0c and CALB4c corresponding to the preamplifiers PB0c and PB4c are controlled. The calibration set values of the preamplifier calibrators CALB0c and CALB4c are set in such a way that the outputs of the comparators CMP0 to CMP4 are toggled between High level and Low level (step S19).

After that, the switch circuit SWAc is turned off (step S20). Then, the calibration analog input signal AIN is input, and the digital value according to the calibration analog input signal AIN is obtained from each comparator. Then, the digital value obtained from each comparator is compared with an expected value preset for the calibration analog input signal AIN, and the input offset amounts of the preamplifiers PA0a to PA0c and PA4a to PA4c are calculated. Based on the calculated input offset amounts, the calibration set values of the preamplifier calibrators CALA0a to CALA0c and CALA4a to CALA4c respectively corresponding to the preamplifiers PA0a to PA0c and PA4a to PA4c are set (step S21). Setting of all the calibration set values is thereby completed, and then the process proceeds to a normal operation.

As described above, in the analog-to-digital converter 4 according to the fifth exemplary embodiment, the preamplifier calibrators CALB are placed also for the subsequent-stage preamplifiers PB. It is thereby possible to set independent calibration set values for the subsequent-stage preamplifiers PB, thereby enabling calibration with higher accuracy than the analog-to-digital converters according to the first to fourth exemplary embodiments.

Sixth Exemplary Embodiment

Figure 12:
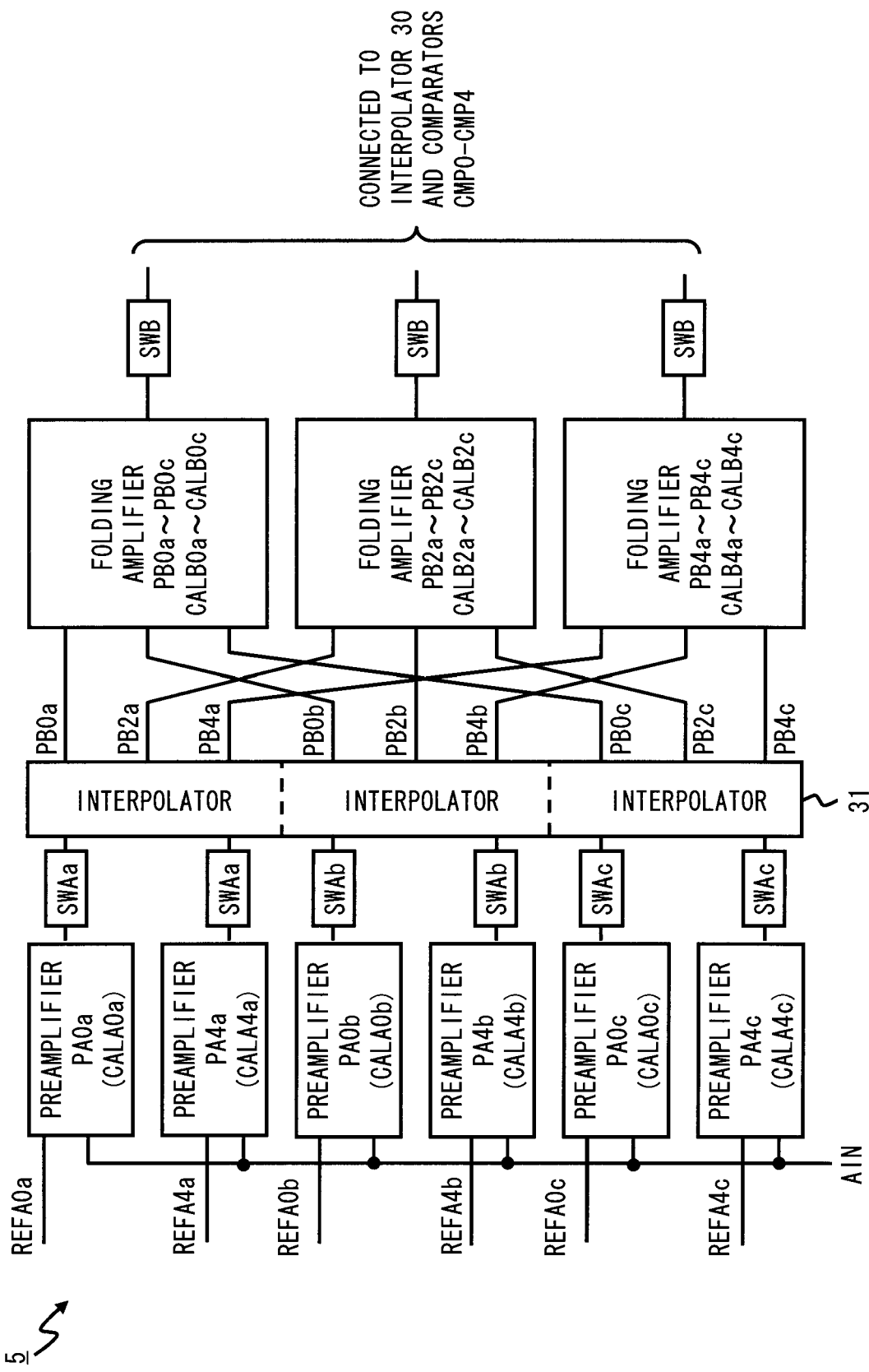
FIG. 12 is a block diagram showing an analog-to-digital converter according to a sixth exemplary embodiment.

FIG. 12 is a block diagram of an analog-to-digital converter 5 according to a sixth exemplary embodiment of the present invention. In the block diagram in FIG. 12, folding amplifiers are shown as one circuit block. Further, previous-stage preamplifiers PA and preamplifier interpolators (e.g. a preamplifier interpolator 31) are also shown as circuit blocks, and detailed elements are not shown in FIG. 12. Further, the interpolator 30 and the comparators CMP, which are connected in the subsequent stage of the folding amplifiers, are also not shown in FIG. 12. The interpolator 30 and the comparators CMP are equivalents of those described in the first to fifth exemplary embodiments.

The analog-to-digital converter 5 according to the sixth exemplary embodiment has a structure in which the number of folding amplifiers serving as the subsequent-stage preamplifiers in the analog-to-digital converter 4 according to the fifth exemplary embodiment increases. While the number of folding amplifiers is two in the analog-to-digital converter 4 according to the fifth exemplary embodiment, the number of folding amplifiers is three in the analog-to-digital converter 5 according to the sixth exemplary embodiment.

Further, in the analog-to-digital converter 5 according to the sixth exemplary embodiment, a signal input to the added folding amplifier (e.g. the preamplifiers PB2*a* to PB2*c* serving as the subsequent-stage preamplifiers) is generated by the interpolator 31. Specifically, the interpolator 31 according to the sixth exemplary embodiment includes two resistors that are connected in series between the outputs of the two preamplifiers PA (e.g. between the preamplifier PA0*a* and the preamplifier PA4*a*). The interpolator 31 then generates a preamplifier interpolation signal to be input to the added folding amplifier between the two resistors. In the example shown in FIG. 9, the added folding amplifier corresponds to an intermediate voltage level between an input voltage level for the folding amplifier composed of the preamplifiers PA0*a* to PA0*c* and an input voltage level for the folding amplifier composed of the preamplifiers PA4*a* to PA4*c*.

Further, in the analog-to-digital converter 5 shown in FIG. 9, the switch circuit SWB is placed at the output of the added folding amplifier.

In the analog-to-digital converter 5 according to the sixth exemplary embodiment, an alternative example of the interpolator 31 in the case of increasing the number of subsequent-stage preamplifiers is shown. Thus, in the analog-to-digital converter according to the exemplary embodiment of the present invention, it is possible to increase the number of subsequent-stage preamplifiers without increasing the number of previous-stage preamplifiers by outputting a signal at the intermediate voltage level from the interpolator 31.

Seventh Exemplary Embodiment

Figure 13:
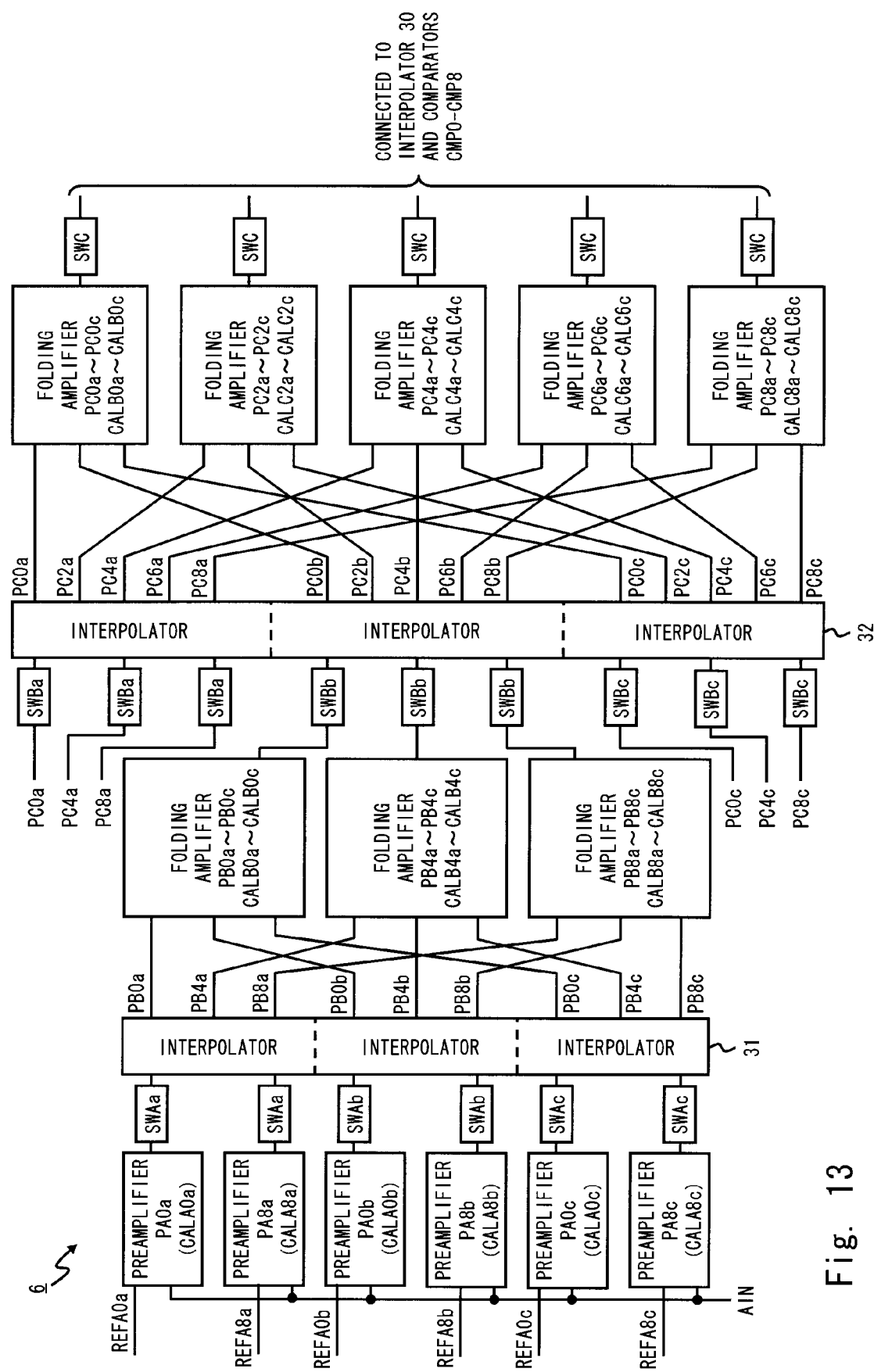
FIG. 13 is a block diagram showing an analog-to-digital converter according to a seventh exemplary embodiment.

FIG. 13 is a block diagram of an analog-to-digital converter 6 according to a seventh exemplary embodiment of the present invention. The block diagram shown in FIG. 13 is an extended version of the block diagram shown in FIG. 12. As shown in FIG. 13, the analog-to-digital converter 6 includes two stages of folding amplifiers, which correspond to the subsequent-stage preamplifiers in the analog-to-digital converter 5 shown in FIG. 12. Further, the analog-to-digital converter 6 shown in FIG. 13 includes nine comparators CMP (e.g. comparators CMP0 to CMP8). Accordingly, the analog-to-digital converter 6 has a higher resolution than the analog-to-digital converters according to the first to sixth exemplary embodiments.

Referring to FIG. 13, the analog-to-digital converter 6 includes previous-stage preamplifiers PA, first subsequent-stage preamplifiers PB, second subsequent-stage preamplifiers PC, interpolators 31 and 32, switch circuits SWAa to SWAc, switch circuits SWBa to SWBc, and switch circuits SWC. The analog-to-digital converter 6 then outputs the output signals of the second subsequent-stage preamplifiers PC to the interpolator 30 and the comparators CMP0 to CMP8, which are described in the first to fourth exemplary embodiments.

Specifically, the analog-to-digital converter 6 includes a plurality of second subsequent-stage preamplifiers PC that output signals to the interpolator 30 and the comparators CMP0 to CMP8. The second subsequent-stage preamplifiers PC are folding amplifiers which are described in the third exemplary embodiment. In the example shown in FIG. 13, the folding amplifier that outputs a signal to the comparator CMP0 is composed of the preamplifiers PC0*a* to PC0*c*, the folding amplifier that outputs a signal to the comparator CMP2 is composed of the preamplifiers PC2*a* to PC2*c*, the folding amplifier that outputs a signal to the comparator CMP4 is composed of the preamplifiers PC4*a* to PC4*c*, the folding amplifier that outputs a signal to the comparator CMP6 is composed of the preamplifiers PC6*a* to PC6*c*, and the folding amplifier that outputs a signal to the comparator CMP8 is composed of the preamplifiers PC8*a* to PC8*c*. Further, the switch circuits SWC are respectively placed at the outputs of the five folding amplifiers PC. The switch circuit SWC makes a short circuit between the output terminals of the corresponding folding amplifier in response to a reset signal.

The preamplifier interpolator (e.g. the interpolator 32) is placed between the second subsequent-stage preamplifiers and the first subsequent-stage preamplifiers. The interpolator 32 generates input signals to the second subsequent-stage preamplifiers PC based on output signals of the first subsequent-stage preamplifiers PB. Specifically, the interpolator 32 receives signals to be input to the 1st subsequent-stage preamplifiers PC0*a*, PC4*a* and PC8*a* of the second subsequent-stage preamplifiers PC from the first subsequent-stage preamplifiers (not shown) and outputs the received signals and preamplifier interpolation signals to be input to the 1st subsequent-stage preamplifiers PC2*a* and PC6*a* of the second subsequent-stage preamplifiers PC which are generated from the received signals. Further, the interpolator 32 receives signals to be input to the 2nd subsequent-stage preamplifiers PC0*b*, PC4*b* and PC8*b* of the second subsequent-stage preamplifiers PC from the first subsequent-stage preamplifiers PB and outputs the received signals and preamplifier interpolation signals to be input to the 2nd subsequent-stage preamplifiers PC2*b* and PC6*b* of the second subsequent-stage preamplifiers PC which are generated from the received signals. Furthermore, the interpolator 32 receives signals to be input to the 3rd subsequent-stage preamplifiers PC0*c*, PC4*c* and PC8*c* of the second subsequent-stage preamplifiers PC from the first subsequent-stage preamplifiers (not shown) and outputs the received signals and preamplifier interpolation signals to be input to the 3rd subsequent-stage preamplifiers PC2*c* and PC6*c* of the second subsequent-stage preamplifiers PC which are generated from the received signals.

FIG. 13 shows only the first subsequent-stage preamplifiers that generate signals corresponding to the 2nd subsequent-stage preamplifiers PC0*b*, PC4*b* and PC8*b* of the folding amplifiers placed as the second subsequent-stage preamplifiers PC. However, the analog-to-digital converter 6 also includes the first subsequent-stage preamplifiers that generate signals corresponding to the 1st subsequent-stage preamplifiers PC0*a*, PC4*a* and PC8*a* of the folding amplifiers placed as the second subsequent-stage preamplifiers PC, and the first subsequent-stage preamplifiers that generate signals corresponding to the 3rd subsequent-stage preamplifiers PC0*c*, PC4*c* and PC8*c* of the folding amplifiers placed as the second subsequent-stage preamplifiers PC. Further, the analog-to-digital converter 6 also includes the previous-stage preamplifiers PA corresponding to the first subsequent-stage preamplifiers PB that generate signals corresponding to the 1st subsequent-stage preamplifiers PC0*a*, PC4*a* and PC8*a*, and the previous-stage preamplifiers PA corresponding to the first subsequent-stage preamplifiers PB that generate signals corresponding to the 3rd subsequent-stage preamplifiers PC0*c*, PC4*c* and PC8*c*. The elements which are not shown are connected in the same manner as the previous-stage preamplifiers PA and the first subsequent-stage preamplifiers PB shown in FIG. 13.

Explanation is given only on the elements shown in FIG. 13. The first subsequent-stage preamplifiers PB form three folding amplifiers. The first subsequent-stage preamplifiers PB0*a* to PB0*c* output signals to be input to the second subsequent-stage preamplifiers PC0b. The first subsequent-stage preamplifiers PB4a to PB4c output signals to be input to the second subsequent-stage preamplifiers PC4b. The first subsequent-stage preamplifiers PB8a to PB8c output signals to be input to the second subsequent-stage preamplifiers PC8b.

Further, the switch circuits SWBb are respectively placed at the outputs of the first subsequent-stage preamplifiers PB shown in FIG. 13, and they make a short circuit between the output terminals of the respective folding amplifiers in response to a reset signal. The switch circuits SWBa are placed at the output terminals of the first subsequent-stage preamplifiers that generate signals corresponding to the subsequent-stage preamplifiers PC0a, PC4a and PC8a and make a short circuit between the output terminals of the first subsequent-stage preamplifiers in response to a reset signal. The switch circuits SWBc are placed at the output terminals of the first subsequent-stage preamplifiers that generate signals corresponding to the subsequent-stage preamplifiers PC0c, PC4c and PC8c and make a short circuit between the output terminals of the first subsequent-stage preamplifiers in response to a reset signal.

The interpolator 31 is placed between the previous-stage preamplifiers and the first subsequent-stage preamplifiers. The interpolator 31 generates input signals to the first subsequent-stage preamplifiers PB on output signals of the previous-stage preamplifiers PA. Specifically, the interpolator 31 receives signals to be input to the 1st subsequent-stage preamplifiers PB0a and PB8a of the first subsequent-stage preamplifiers PB from the previous-stage preamplifiers PA0a and PA8a and outputs the received signals and signals to be input to the 1st subsequent-stage preamplifier PB4a of the first subsequent-stage preamplifiers PB which is generated from the received signals. Further, the interpolator 31 receives signals to be input to the 2nd subsequent-stage preamplifiers PB0b and PB8b of the first subsequent-stage preamplifiers PB from the previous-stage preamplifiers PA0b and PA8b and outputs the received signals and signals to be input to the 2nd subsequent-stage preamplifier PB4b of the first subsequent-stage preamplifiers PB which is generated from the received signals. Furthermore, the interpolator 31 receives signals to be input to the 3rd subsequent-stage preamplifiers PB0c and PB8c of the first subsequent-stage preamplifiers PB from the previous-stage preamplifiers PA0c and PA8c and outputs the received signals and signals to be input to the 3rd subsequent-stage preamplifier PB4c of the first subsequent-stage preamplifiers PB which is generated from the received signals.

Further, the switch circuits SWAa are respectively placed at the outputs of the previous-stage preamplifiers PA0a and PA8a shown in FIG. 13 and make a short circuit between the output terminals of the respective previous-stage preamplifiers PA in response to a reset signal. Further, the switch circuits SWAb are respectively placed at the outputs of the previous-stage preamplifiers PA0b and PA8b and make a short circuit between the output terminals of the respective previous-stage preamplifiers PA in response to a reset signal. Furthermore, the switch circuits SWAc are respectively placed at the outputs of the previous-stage preamplifiers PA0c and PA8c and make a short circuit between the output terminals of the respective previous-stage preamplifiers PA in response to a reset signal.

The calibration operation of the analog-to-digital converter 6 according to the seventh exemplary embodiment is described hereinafter. In the analog-to-digital converter 6 according to the seventh exemplary embodiment, as in the analog-to-digital converter 2 according to the second exemplary embodiment, the switch circuit placed in the previous stage of the comparator or the preamplifier for which the calibration set value is to be set is turned on. At this time, because the switch circuits are placed in a plurality of stages in the analog-to-digital converter 6 according to the seventh exemplary embodiment, calibration is performed according to the flowchart shown in FIG. 14.

Although explanation of the preamplifier calibrators and the comparator calibrators is omitted in the above description, those calibrators are mounted also in the analog-to-digital converter 6 according to the seventh exemplary embodiment.

Figure 14:
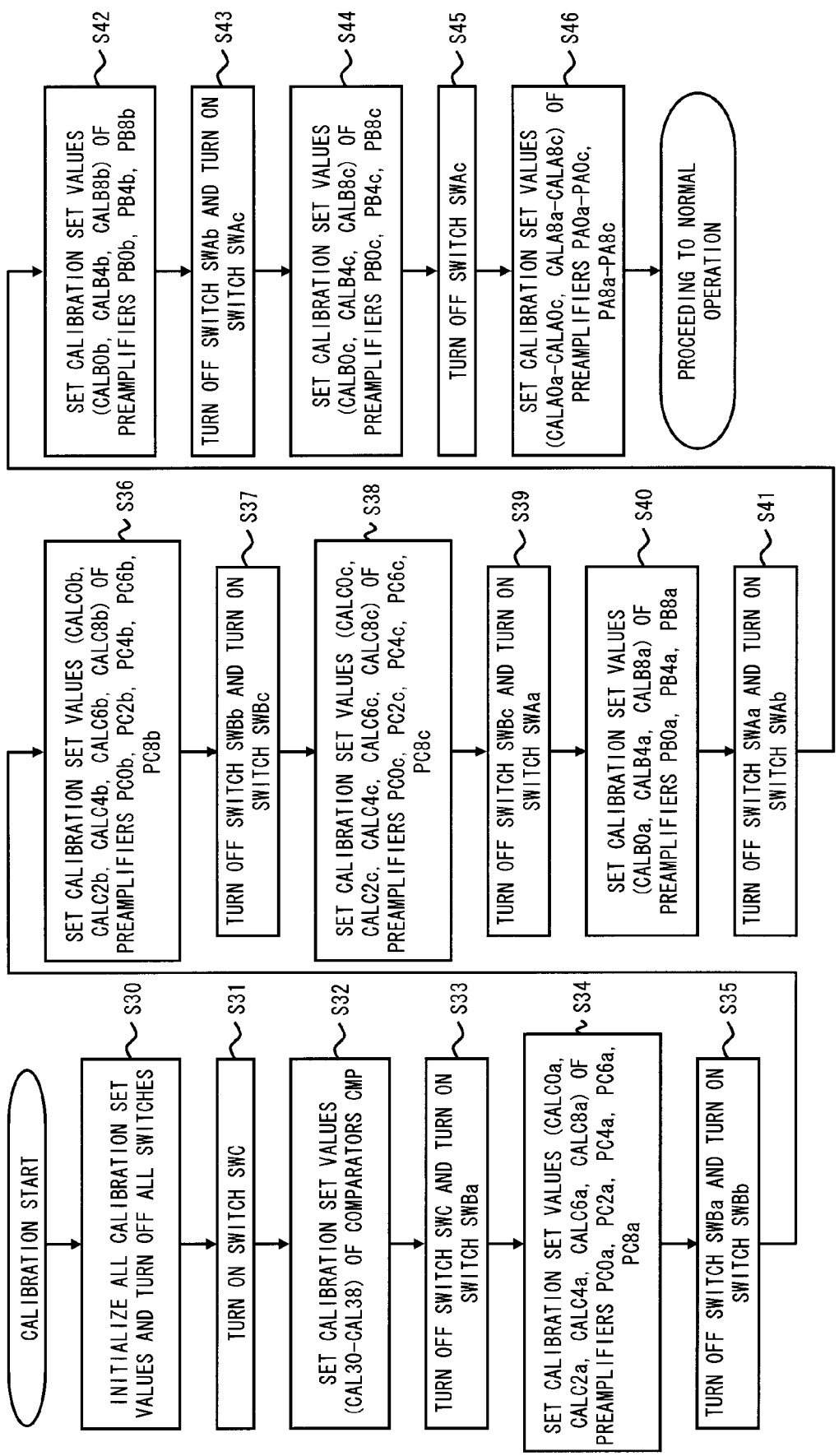
FIG. 14 is a flowchart showing a procedure of setting calibration set values in the analog-to-digital converter according to the seventh exemplary embodiment.

Referring to FIG. 14, in the analog-to-digital converter 6, all calibration set values are initialized at the start of calibration. Further, all switch circuits are turned off (step S30). Next, the switch circuits SWC are turned on (step S31). The non-inverting input terminals and the inverting input terminals of the comparators CMP0 to CMP8 thereby become the same potential. In this state, the calibration set values of the comparator calibrators CAL30 to CAL38 corresponding to the comparators CMP0 to CMP8 are controlled. The calibration set values are set in such a way that the outputs of the comparators CMP0 to CMP8 are toggled between High level and Low level (step S32).

Then, the switch circuits SWC are turned off, and the switch circuits SWBa are turned on (step S33). The non-inverting input terminals and the inverting input terminals of the 1st preamplifiers (the preamplifiers PC0a, PC2a, PC4a, PC6a and PC8a in FIG. 13) of the folding amplifiers as the second subsequent-stage preamplifiers thereby become the same potential. Then, the calibration set values of the preamplifier calibrators CALC0a, CALC2a, CALC4a, CALC6a and CALC8a corresponding to the preamplifiers PC0a, PC2a, PC4a, PC6a and PC8a are controlled. The calibration set values of the preamplifier calibrators CALC0a, CALC2a, CALC4a, CALC6a and CALC8a are set in such a way that the outputs of the comparators CMP0 to CMP8 are toggled between High level and Low level (step S34).

Then, the switch circuits SWBa are turned off, and the switch circuits SWBb are turned on (step S35). The non-inverting input terminals and the inverting input terminals of the 2nd preamplifiers (the preamplifiers PC0b, PC2b, PC4b, PC6b and PC8b in FIG. 13) of the folding amplifiers as the second subsequent-stage preamplifiers thereby become the same potential. Then, the calibration set values of the preamplifier calibrators CALC0b, CALC2b, CALC4b, CALC6b and CALC8b corresponding to the preamplifiers PC0b, PC2b, PC4b, PC6b and PC8b are controlled. The calibration set values of the preamplifier calibrators CALC0b, CALC2b, CALC4b, CALC6b and CALC8b are set in such a way that the outputs of the comparators CMP0 to CMP8 are toggled between High level and Low level (step S36).

Then, the switch circuits SWBb are turned off, and the switch circuits SWBc are turned on (step S37). The non-inverting input terminals and the inverting input terminals of the 3rd preamplifiers (the preamplifiers PC0c, PC2c, PC4c, PC6c and PC8c in FIG. 13) of the folding amplifiers as the second subsequent-stage preamplifiers thereby become the same potential. Then, the calibration set values of the preamplifier calibrators CALC0c, CALC2c, CALC4c, CALC6c and CALC8c corresponding to the preamplifiers PC0c, PC2c, PC4c, PC6c and PC8c are controlled. The calibration set values of the preamplifier calibrators CALC0c, CALC2c, CALC4c, CALC6c and CALC8c are set in such a way that the outputs of the comparators CMP0 to CMP8 are toggled between High level and Low level (step S38).

Then, the switch circuits SWBc are turned off, and the switch circuits SWAa are turned on (step S39). The non-inverting input terminals and the inverting input terminals of the 1st preamplifiers (the preamplifiers PB0a, PB4a and PB8a in FIG. 13) of the folding amplifiers as the first subsequent-stage preamplifiers thereby become the same potential. Then, the calibration set values of the preamplifier calibrators CALB0a, CALB4a and CALB8a corresponding to the preamplifiers PB0a, PB4a and PB8a are controlled. The calibration set values of the preamplifier calibrators CALB0a, CALB4a and CALB8a are set in such a way that the outputs of the comparators CMP0 to CMP8 are toggled between High level and Low level (step S40).

Then, the switch circuits SWAa are turned off, and the switch circuits SWAb are turned on (step S41). The non-inverting input terminals and the inverting input terminals of the 2nd preamplifiers (the preamplifiers PB0b, PB4b and PB8b in FIG. 13) of the folding amplifiers as the first subsequent-stage preamplifiers thereby become the same potential. Then, the calibration set values of the preamplifier calibrators CALB0b, CALB4b and CALB8b corresponding to the preamplifiers PB0b, PB4b and PB8b are controlled. The calibration set values of the preamplifier calibrators CALB0b, CALB4b and CALB8b are set in such a way that the outputs of the comparators CMP0 to CMP8 are toggled between High level and Low level (step S42).

Then, the switch circuits SWAb are turned off, and the switch circuits SWAc are turned on (step S43). The non-inverting input terminals and the inverting input terminals of the 3rd preamplifiers (the preamplifiers PB0c, PB4c and PB8c in FIG. 13) of the folding amplifiers as the first subsequent-stage preamplifiers thereby become the same potential. Then, the calibration set values of the preamplifier calibrators CALB0c, CALB4c and CALB8c corresponding to the preamplifiers PB0c, PB4c and PB8c are controlled. The calibration set values of the preamplifier calibrators CALB0c, CALB4c and CALB8c are set in such a way that the outputs of the comparators CMP0 to CMP8 are toggled between High level and Low level (step S44).

After that, the switch circuits SWAc are turned off (step S45). Then, the calibration analog input signal AIN is input, and the digital value according to the calibration analog input signal AIN is obtained from each comparator. Then, the digital value obtained from each comparator is compared with an expected value preset for the calibration analog input signal AIN, and the input offset amounts of the preamplifiers PA0a to PA0c and PA8a to PA8c are calculated. Based on the calculated input offset amounts, the calibration set values of the preamplifier calibrators CALA0a to CALA0c and CALA8a to CALA8c respectively corresponding to the preamplifiers PA0a to PA0c and PA8a to PA8c are set (step S46). Setting of all the calibration set values is thereby completed, and then the process proceeds to a normal operation.

As described above, in the analog-to-digital converter 6 according to the seventh exemplary embodiment, the subsequent-stage preamplifiers are formed by two stages of folding amplifiers. Then, the preamplifier calibrators CALB and CALC are placed also for the first subsequent-stage preamplifiers PB and the second subsequent-stage preamplifiers PC that constitute the two stages of folding amplifiers. It is thus possible to set independent calibration set values for the subsequent-stage preamplifiers PB and PC, thereby enabling calibration with higher accuracy than the analog-to-digital converters according to the first to sixth exemplary embodiments.

Eighth Exemplary Embodiment

In the folding amplifier described in the above exemplary embodiments, other preamplifiers are operating during the calibration operation on one preamplifier. On the other hand, in an analog-to-digital converter according to an eighth exemplary embodiment, other preamplifiers stop operating during the period of performing the calibration operation on one preamplifier among preamplifiers constituting the folding amplifiers.

Figure 15:
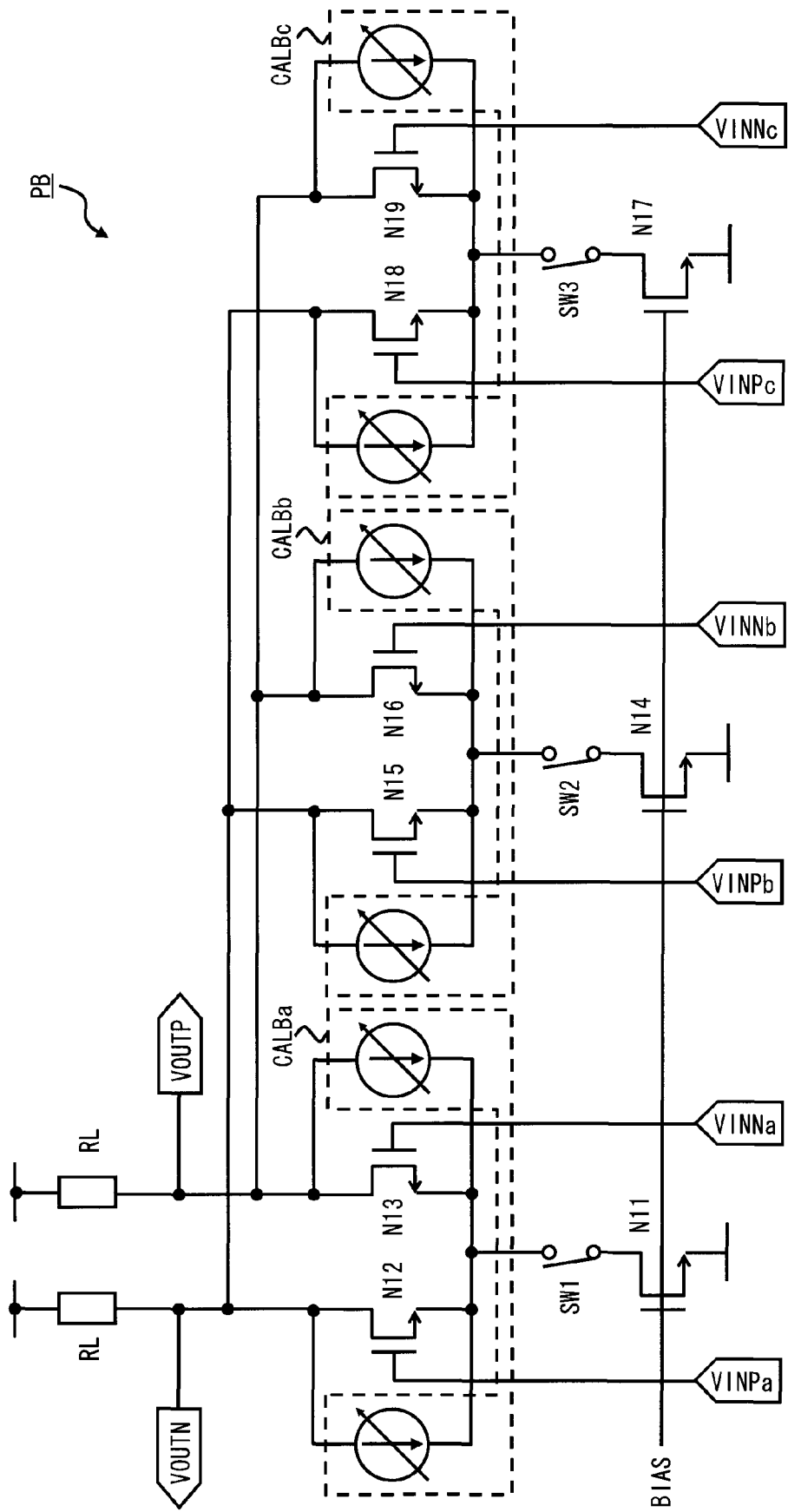
FIG. 15 is a circuit diagram showing a subsequent-stage preamplifier and a preamplifier calibrator according to an eighth exemplary embodiment.

FIG. 15 is a circuit diagram of the folding amplifier according to the eighth exemplary embodiment. The folding amplifier PB shown in FIG. 15 has a structure in which switch circuits SW1 to SW3 are added to the folding amplifier PB shown in FIG. 10. The switch circuits SW1 to SW3 are respectively placed between the transistors N11, N14 and N17 as current sources and differential pairs corresponding to the respective current sources. The switch circuits SW1 to SW3 are turned on or off according to a control signal.

Figure 16:
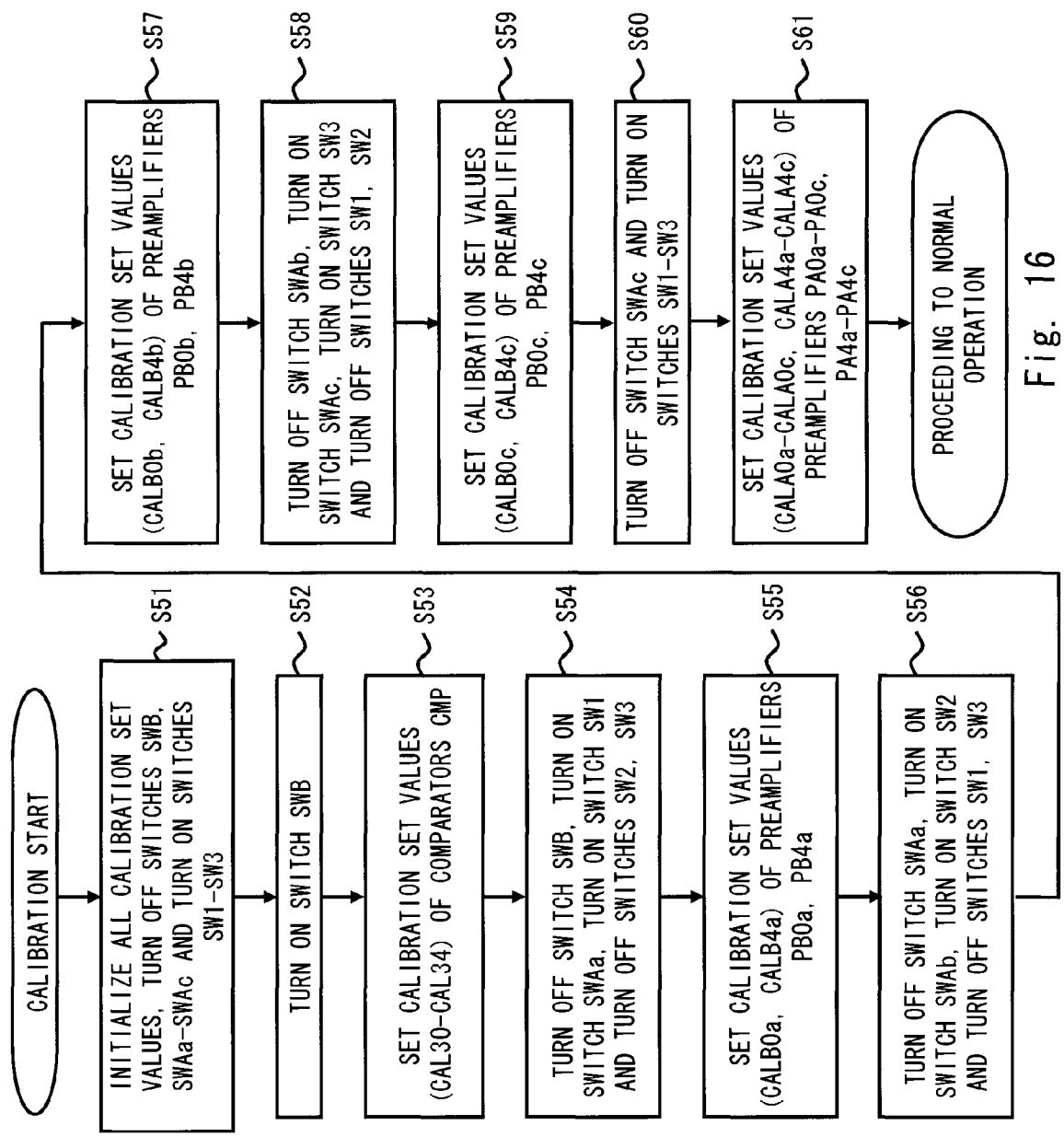
FIG. 16 is a flowchart showing a procedure of setting calibration set values in the analog-to-digital converter according to the eighth exemplary embodiment.
Figure 17:
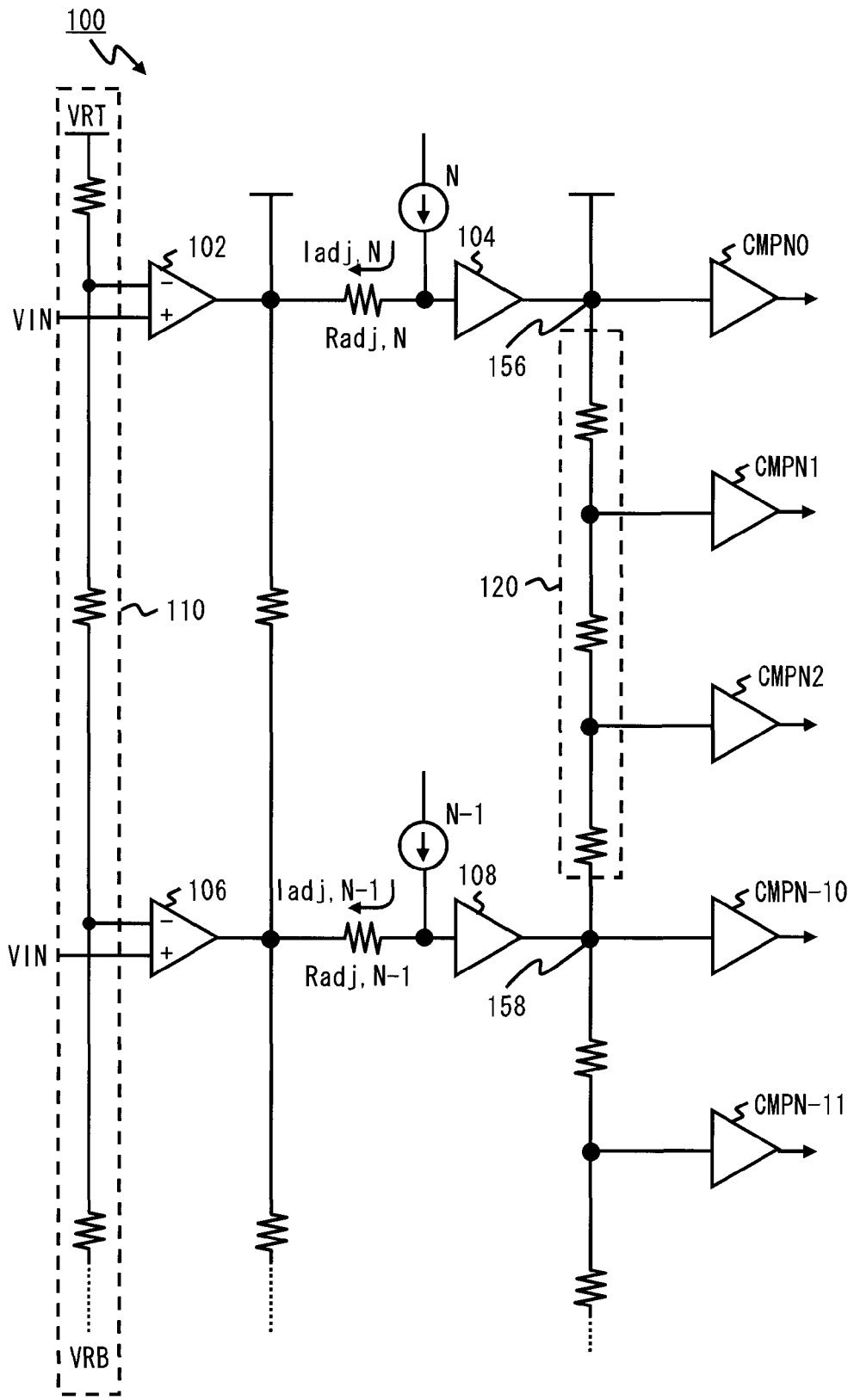
FIG. 17 is a block diagram showing an analog-to-digital converter according to prior art.

The calibration operation of the analog-to-digital converter that includes the folding amplifier PB shown in FIG. 15 is described hereinafter. In the eighth exemplary embodiment, the operation in the case of using the folding amplifier PB shown in FIG. 15 in the analog-to-digital converter according to the fifth exemplary embodiment is described. FIG. 16 shows a flowchart of the calibration operation of the analog-to-digital converter according to the eighth exemplary embodiment.

Referring to FIG. 16, in the analog-to-digital converter according to the eighth exemplary embodiment, all calibration set values are initialized at the start of calibration. Further, the switch circuits SWB and SWAa to SWAc are turned off, and the switch circuits SW1 to SW3 are turned on (step S51). Next, the switch circuits SWB are turned on (step S52). The non-inverting input terminals and the inverting input terminals of the comparators CMP0 to CMP4 thereby become the same potential. In this state, the calibration set values of the comparator calibrators CAL30 to CAL34 corresponding to the comparators CMP0 to CMP4 are controlled. The calibration set values are set in such a way that the outputs of the comparators CMP0 to CMP4 are toggled between High level and Low level (step S53).

Then, the switch circuits SWB, SW2 and SW3 are turned off, and the switch circuits SWAa and SW1 are turned on (step S54). The non-inverting input terminals and the inverting input terminals of the 1st preamplifiers (the preamplifier PB0a and the preamplifier PB4a in FIG. 9) of the folding amplifier thereby become the same potential. Further, the 2nd preamplifiers (the preamplifier PB0b and the preamplifier PB4b in FIG. 9) of the folding amplifiers and the 3rd preamplifiers (the preamplifier PB0c and the preamplifier PB4c in FIG. 9) of the folding amplifiers stop operating. Then, the calibration set values of the preamplifier calibrators CALB0a and CALB4a corresponding to the preamplifiers PB0a and PB4a are controlled. The calibration set values of the preamplifier calibrators CALB0a and CALB4a are set in such a way that the outputs of the comparators CMP0 to CMP4 are toggled between High level and Low level (step S55).

Then, the switch circuits SWAa, SW1 and SW3 are turned off, and the switch circuits SWAb and SW2 are turned on (step S56). The non-inverting input terminals and the inverting input terminals of the 2nd preamplifiers (the preamplifier PB0b and the preamplifier PB4b in FIG. 9) of the folding amplifiers thereby become the same potential. Further, the 1st preamplifiers (the preamplifier PB0a and the preamplifier PB4a in FIG. 9) of the folding amplifiers and the 3rd preamplifiers (the preamplifier PB0c and the preamplifier PB4c in FIG. 9) of the folding amplifiers stop operating. Then, the calibration set values of the preamplifier calibrators CALB0b and CALB4b corresponding to the preamplifiers PB0b and PB4b are controlled. The calibration set values of the preamplifier calibrators CALB0b and CALB4b are set in such a way that the outputs of the comparators CMP0 to CMP4 are toggled between High level and Low level (step S57).

Then, the switch circuits SWAb, SW1 and SW2 are turned off, and the switch circuits SWAc and SW3 are turned on (step S58). The non-inverting input terminals and the inverting input terminals of the 3rd preamplifiers (the preamplifier PB0c and the preamplifier PB4c in FIG. 9) of the folding amplifiers thereby become the same potential. Further, the 1st preamplifiers (the preamplifier PB0a and the preamplifier PB4a in FIG. 9) of the folding amplifiers and the 2nd preamplifiers (the preamplifier PB0b and the preamplifier PB4b in FIG. 9) of the folding amplifiers stop operating. Then, the calibration set values of the preamplifier calibrators CALB0c and CALB4c corresponding to the preamplifiers PB0c and PB4c are controlled. The calibration set values of the preamplifier calibrators CALB0c and CALB4c are set in such a way that the outputs of the comparators CMP0 to CMP4 are toggled between High level and Low level (step S59).

After that, the switch circuit SWAc is turned off, and the switch circuits SW1 to SW3 are turned on (step S60). Then, the calibration analog input signal AIN is input, and the digital value according to the calibration analog input signal AIN is obtained from each comparator. Then, the digital value obtained from each comparator is compared with an expected value preset for the calibration analog input signal AIN, and the input offset amounts of the preamplifiers PA0a to PA0c and PA4a to PA4c are calculated. Based on the calculated input offset amounts, the calibration set values of the preamplifier calibrators CALA0a to CALA0c and CALA4a to CALA4c respectively corresponding to the preamplifiers PA0a to PA0c and PA4a to PA4c are set (step S61). Setting of all the calibration set values is thereby completed, and then the process proceeds to a normal operation.

As described above, in the analog-to-digital converter according to the eighth exemplary embodiment, when setting the calibration set value of the subsequent-stage preamplifiers PB constituting the folding amplifier, the operation of the subsequent-stage preamplifiers PB that are not calibration targets is stopped. It is thereby possible to accurately calibrate only the subsequent-stage preamplifiers that are calibration targets. The analog-to-digital converter according to the eighth exemplary embodiment can thereby perform offset correction by calibration with higher accuracy than the other exemplary embodiments.

The present invention is not restricted to the above-described exemplary embodiments, and various changes and modifications may be made without departing from the scope of the invention. For example, the number of preamplifiers and the number of comparators in the analog-to-digital converter may be varied according to the specifications of the analog-to-digital converter.

The first to eighth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An analog-to-digital converter comprising:
 a first preamplifier that receives a first reference voltage and an input signal;
 a second preamplifier that receives a second reference voltage and the input signal;
 a first preamplifier calibrator that is placed corresponding to the first preamplifier and adjusts an input offset of the first preamplifier;
 a second preamplifier calibrator that is placed corresponding to the second preamplifier and adjusts an input offset of the second preamplifier;
 an interpolator that is placed between an output terminal of the first preamplifier and an output terminal of the second preamplifier and generates an interpolation signal having a voltage value between a first output signal from the first preamplifier and a second output signal from the second preamplifier;
 a plurality of comparators that receive one of the first output signal, the second output signal and the interpolation signal and output a digital value based on the received signal; and
 a plurality of comparator calibrators that are placed respectively corresponding to at least comparators receiving the interpolation signal among the plurality of comparators and adjust input offsets of the corresponding comparators.

2. The analog-to-digital converter according to claim 1, wherein the plurality of comparator calibrators include a comparator calibrator corresponding to a comparator receiving one of the first output signal and the second output signal.

3. The analog-to-digital converter according to claim 1, wherein
 a calibration set value is set for each of the first and second preamplifier calibrators and the plurality of comparator calibrators, and
 the first and second preamplifier calibrators and the plurality of comparator calibrators adjust an input offset amount of a corresponding preamplifier or comparator according to the calibration set value.

4. The analog-to-digital converter according to claim 3, wherein the calibration set value is calculated based on a difference between a digital output value of the analog-to-digital converter corresponding to a calibration analog input signal and a reference digital value corresponding to the calibration analog input signal.

5. The analog-to-digital converter according to claim 3, wherein the calibration set value has an independent value for each of the first and second preamplifier calibrators and the plurality of comparator calibrators.

6. The analog-to-digital converter according to claim 4, wherein the calibration set value has an independent value for each of the first and second preamplifier calibrators and the plurality of comparator calibrators.

7. The analog-to-digital converter according to claim 1, wherein
 the first and second preamplifiers are composed of a plurality of stages of preamplifiers, and
 the first and second preamplifier calibrators are placed for at least one of the plurality of stages of preamplifiers.

8. The analog-to-digital converter according to claim 1, wherein
 the first and second output signals are differential signals,
 a switch circuit is placed between the output terminals of the first and second preamplifiers, that makes a short circuit between the output terminals according to an externally input reset signal, and
 calibration is performed in the plurality of comparators during a period when the switch circuit is short-circuited.

9. The analog-to-digital converter according to claim 1, wherein the first and second preamplifiers have a folding amplifier structure where outputs of a plurality of preamplifiers placed in parallel are connected together.

10. The analog-to-digital converter according to claim 9, wherein
the plurality of preamplifiers respectively include a switch circuit that makes a short circuit between input terminals,
the switch circuit is controlled independently for each corresponding preamplifier, and
calibration is performed in the plurality of preamplifiers during a period when the switch circuit is short-circuited.

11. The analog-to-digital converter according to claim 9, wherein the preamplifier having the folding amplifier structure operates in a state of being a calibration target and stops operating in a state of not being a calibration target during a calibration period.

12. The analog-to-digital converter according to claim 1, wherein an adjustment amount of the input offset adjusted by the first and second preamplifier calibrators and the plurality of comparator calibrators is calculated by setting a sum of adjustment amounts of the input offset for a plurality of preamplifiers included in the first preamplifier to zero.

13. The analog-to-digital converter according to claim 1, wherein
the first and second preamplifiers are composed of a plurality of stages of preamplifiers, and
the first and second preamplifier calibrators are placed for all of the plurality of stages of preamplifiers.

14. The analog-to-digital converter according to claim 13, wherein
the first and second output signals are differential signals, and
a switch circuit is placed between output terminals of each of the plurality of stages of preamplifiers constituting the first and second preamplifiers, that makes a short circuit between the output terminals according to an externally input reset signal.

15. The analog-to-digital converter according to claim 13, wherein
the first and second preamplifiers include a preamplifier interpolator that generates a preamplifier interpolation signal having a voltage value between outputs signals of two preamplifiers placed in a previous stage, and
a preamplifier placed in a subsequent stage among the plurality of stages of preamplifiers includes a preamplifier that receives an output signal of a preamplifier in a previous stage through the preamplifier interpolator and a preamplifier that receives the preamplifier interpolation signal.

16. The analog-to-digital converter according to claim 14, wherein
the first and second preamplifiers include a preamplifier interpolator that generates a preamplifier interpolation signal having a voltage value between outputs signals of two preamplifiers placed in a previous stage, and
a preamplifier placed in a subsequent stage among the plurality of stages of preamplifiers includes a preamplifier that receives an output signal of a preamplifier in a previous stage through the preamplifier interpolator and a preamplifier that receives the preamplifier interpolation signal.

* * * * *